(12) United States Patent
Bennett et al.

(10) Patent No.: US 7,315,917 B2
(45) Date of Patent: Jan. 1, 2008

(54) SCHEDULING OF HOUSEKEEPING OPERATIONS IN FLASH MEMORY SYSTEMS

(75) Inventors: Alan David Bennett, Edinburgh (GB); Sergey Anatolievich Gorobets, Edinburgh (GB); Andrew Tomlin, San Jose, CA (US); Charles Schroter, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/312,985

(22) Filed: Dec. 19, 2005

(65) Prior Publication Data

US 2006/0161728 A1 Jul. 20, 2006

Related U.S. Application Data

(63) Continuation-in-part of application No. 11/040,325, filed on Jan. 20, 2005.

(51) Int. Cl.
*G06F 12/00* (2006.01)
*G06F 13/00* (2006.01)

(52) U.S. Cl. .................. 711/103; 711/100; 711/154

(58) Field of Classification Search ............ 711/103, 711/100, 154; 707/206
See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,268,870 A | 12/1993 | Harari | |
| 5,313,421 A | 5/1994 | Guterman et al. | |
| 5,315,541 A | 5/1994 | Harari et al. | |
| 5,341,339 A * | 8/1994 | Wells | 365/185.11 |
| 5,343,063 A | 8/1994 | Yuan et al. | |
| 5,388,083 A | 2/1995 | Assar et al. | |
| 5,479,633 A * | 12/1995 | Wells et al. | 711/103 |

(Continued)

FOREIGN PATENT DOCUMENTS

WO    WO 00/49488    8/2000

(Continued)

OTHER PUBLICATIONS

Park, Chanik. "Cost-Efficient Memory Architecture Design of NAND Flash Memory Embedded Systems". Proceedings of the 21st International Conference on Computer Design. 2003. pp. 1-6.*

(Continued)

*Primary Examiner*—Tuan V. Thai
(74) *Attorney, Agent, or Firm*—Davis Wright Tremaine LLP

(57) ABSTRACT

A re-programmable non-volatile memory system, such as a flash EEPROM system, having its memory cells grouped into blocks of cells that are simultaneously erasable is operated to perform memory system housekeeping operations in the foreground during execution of a host command, wherein the housekeeping operations are unrelated to execution of the host command. Both one or more such housekeeping operations and execution of the host command are performed within a time budget established for executing that particular command. One such command is to write data being received to the memory. One such housekeeping operation is to level out the wear of the individual blocks that accumulates through repetitive erasing and re-programming.

27 Claims, 15 Drawing Sheets

U.S. PATENT DOCUMENTS

| | | | |
|---|---|---|---|
| 5,479,638 A | 12/1995 | Assar et al. | |
| 5,485,595 A | 1/1996 | Assar et al. | |
| 5,530,828 A | 6/1996 | Kaki et al. | |
| 5,532,962 A | 7/1996 | Auclair et al. | |
| 5,570,315 A | 10/1996 | Tanaka et al. | |
| 5,640,529 A | 6/1997 | Hasbun | |
| 5,644,539 A | 7/1997 | Yamagami et al. | |
| 5,661,053 A | 8/1997 | Yuan | |
| 5,768,192 A | 6/1998 | Eitan | |
| 5,774,397 A | 6/1998 | Endoh et al. | |
| 5,798,968 A | 8/1998 | Lee et al. | |
| 5,890,192 A | 3/1999 | Lee et al. | |
| 5,903,495 A | 5/1999 | Takeuchi et al. | |
| 5,909,449 A | 6/1999 | So et al. | |
| 5,930,167 A | 7/1999 | Lee et al. | |
| 5,956,743 A | 9/1999 | Bruce et al. | |
| 6,000,006 A | 12/1999 | Bruce et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,230,233 B1 | 5/2001 | Lofgren et al. | |
| 6,233,644 B1* | 5/2001 | Dahlen et al. | 710/200 |
| 6,286,016 B1* | 9/2001 | Heller et al. | 707/206 |
| 6,345,001 B1 | 2/2002 | Mokhlesi | |
| 6,373,746 B1 | 4/2002 | Takeuchi et al. | |
| 6,426,893 B1 | 7/2002 | Conley et al. | |
| 6,456,528 B1 | 9/2002 | Chen | |
| 6,522,580 B2 | 2/2003 | Chen et al. | |
| 6,567,307 B1 | 5/2003 | Estakhri | |
| 6,732,221 B2 | 5/2004 | Ban | |
| 6,763,424 B2 | 7/2004 | Conley | |
| 6,771,536 B2 | 8/2004 | Li et al. | |
| 6,781,877 B2 | 8/2004 | Cernea et al. | |
| 7,012,835 B2 | 3/2006 | Gonzalez et al. | |
| 2002/0099904 A1 | 7/2002 | Conley | |
| 2002/0184432 A1* | 12/2002 | Ban | 711/102 |
| 2003/0046487 A1 | 3/2003 | Swaminathan | |
| 2003/0109093 A1 | 6/2003 | Harari et al. | |
| 2003/0225961 A1* | 12/2003 | Chow et al. | 711/103 |
| 2004/0083335 A1 | 4/2004 | Gonzalez et al. | |
| 2004/0177212 A1 | 9/2004 | Chang et al. | |
| 2005/0073884 A1 | 4/2005 | Gonzalez et al. | |
| 2005/0144357 A1 | 6/2005 | Sinclair | |
| 2005/0144365 A1 | 6/2005 | Gorobets et al. | |
| 2005/0144516 A1 | 6/2005 | Gonzalez et al. | |
| 2005/0166087 A1 | 7/2005 | Gorobets | |
| 2005/0204187 A1* | 9/2005 | Lee et al. | 714/8 |
| 2006/0047920 A1 | 3/2006 | Moore et al. | |
| 2006/0053247 A1* | 3/2006 | Cheung et al. | 711/103 |
| 2006/0106972 A1 | 5/2006 | Gorobets et al. | |
| 2006/0155922 A1 | 7/2006 | Gorobets et al. | |
| 2006/0161724 A1 | 7/2006 | Bennett et al. | |

FOREIGN PATENT DOCUMENTS

| | | |
|---|---|---|
| WO | WO 03/027828 A1 | 4/2003 |
| WO | WO2004/040459 A1 | 5/2004 |
| WO | WO2004/040578 A2 | 5/2004 |
| WO | WO2004/040585 A1 | 5/2004 |

OTHER PUBLICATIONS

Chang, Li-Pin. "An Adaptive Striping Architecture for Flash Memory Storage Systems of Embedded Systems". Proceedings of the Eighth IEEE Real-Time and Embedded Technology and Applications Symposium. 2002. pp. 1-10.*

Chiang, Mei-Ling. "Managing Flash Memory in Personal Communication Devices". IEEE. 1997. pp. 177-182.*

Chiang, M. L. "Cleaning Policies in Mobile Computers using Flash Memory." Journal of Systems and Software. Elsevier Science, 1999. pp. 213-231.*

"3.1: Objects, values and types". Python Library Reference. 2004. http://web.archive.org/web/20040823015823/docs.python.org/ref/about.html.*

Kalinsky, David. "Introduction to Priority Inversions". Embedded Systems Programming. Apr. 2002. pp. 55-56. http://www.netrino.com/Publications/Glossary/PriorityInversion.html.*

European Patent Office/International Searching Authority, "Notification of Transmittal of the International Search Report and the Written Opinion of the International Searching Authority, or the Declaration," mailed in corresponding International Application No. PCT/US2006/001070 on Sep. 4, 2006, 15 pages.

ISA/EPO, "Invitation to Pay Additional Fees including Partial International Search Report," mailed in related Application No. PCT/US2006/001070 on Jun. 20, 2006, 7 pages.

* cited by examiner

SCHEDULING OF HOUSEKEEPING OPERATIONS IN FLASH MEMORY SYSTEMS

CROSS REFERENCE TO RELATED APPLICATION

This application is a continuation-in-part of U.S. patent application Ser. No. 11/040,325 filed on Jan. 20, 2005.

BACKGROUND AND SUMMARY OF RELATED PATENTS AND APPLICATIONS

This invention relates generally to the operation of non-volatile flash memory systems, and, more specifically, to techniques of carrying out housekeeping operations, such as wear leveling, in such memory systems. All patents, patent applications, articles and other publications referenced herein are hereby incorporated herein by these references in their entirety for all purposes.

There are many commercially successful non-volatile memory products being used today, particularly in the form of small form factor removable cards or embedded modules, which employ an array of flash EEPROM (Electrically Erasable and Programmable Read Only Memory) cells formed on one or more integrated circuit chips. A memory controller, usually but not necessarily on a separate integrated circuit chip, is included in the memory system to interface with a host to which the system is connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data. Other memory cards and embedded modules do not include such a controller but rather the host to which they are connected includes software that provides the controller function. Memory systems in the form of cards include a connector that mates with a receptacle on the outside of the host. Memory systems embedded within hosts, on the other hand, are not intended to be removed.

Some of the commercially available memory cards that include a controller are sold under the following trademarks: CompactFlash (CF), MultiMedia(MMC), Secure Digital (SD), MiniSD, MicroSD, and TransFlash. An example of a memory system that does not include a controller is the SmartMedia card. All of these cards are available from SanDisk Corporation, assignee hereof. Each of these cards has a particular mechanical and electrical interface with host devices to which it is removably connected. Another class of small, hand-held flash memory devices includes flash drives that interface with a host through a standard Universal Serial Bus (USB) connector. SanDisk Corporation provides such devices under its Cruzer trademark. Hosts for cards include personal computers, notebook computers, personal digital assistants (PDAs), various data communication devices, digital cameras, cellular telephones, portable audio players, automobile sound systems, and similar types of equipment. A flash drive works with any host having a USB receptacle, such as personal and notebook computers.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343, 063, 5,661,053 and 6,222,762.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, 6,373,746, 6,456,528, 6,522,580, 6,771,536 and 6,781,877.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in U.S. patent application publication no. US 2003/0109093 of Harari et al.

As in most all integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, and for structures using dielectric floating gates in aforementioned United States patent application publication no. US 2003/0109093. Selected portions of a multi-state memory cell array may also be operated in two states (binary) for various reasons, in a manner described in U.S. Pat. Nos. 5,930,167 and 6,456,528.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism during programming user data into the memory array and read user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, blocks may be linked together to form virtual blocks or metablocks. That is, each metablock is defined to include one block from each plane. Use of the metablock is described in U.S. Pat. No. 6,763,424. The physical address of a metablock is established by translation from a logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

It is common to operate large block or metablock systems with some extra blocks maintained in an erased block pool. When one or more pages of data less than the capacity of a block are being updated, it is typical to write the updated pages to an erased block from the pool and then copy data of the unchanged pages from the original block to erase pool block. Variations of this technique are described in aforementioned U.S. Pat. No. 6,763,424. Over time, as a result of host data files being re-written and updated, many blocks can end up with a relatively few number of its pages containing valid data and remaining pages containing data that is no longer current. In order to be able to efficiently use the data storage capacity of the array, logically related pages of valid data are from time-to-time gathered together from fragments among multiple blocks and consolidated together into a fewer number of blocks. This process is commonly termed "garbage collection."

Data within a single block or metablock may also be compacted when a significant amount of data in the block becomes obsolete. This involves copying the remaining valid data of the block into a blank erased block and then erasing the original block. The copy block then contains the valid data from the original block plus erased storage capacity that was previously occupied by obsolete data. The valid data is also typically arranged in logical order within the copy block, thereby making reading of the data easier.

Control data for operation of the memory system are typically stored in one or more reserved blocks or metablocks. Such control data include operating parameters such as programming and erase voltages, file directory information and block allocation information. As much of the information as necessary at a given time for the controller to operate the memory system are also stored in RAM and then written back to the flash memory when updated. Frequent updates of the control data results in frequent compaction and/or garbage collection of the reserved blocks. If there are multiple reserved blocks, garbage collection of two or more reserve blocks can be triggered at the same time. In order to avoid such a time consuming operation, voluntary garbage collection of reserved blocks is initiated before necessary and at a times when they can be accommodated by the host. Such pre-emptive data relocation techniques are described in U.S. patent application Ser. No. 10/917,725, filed Aug. 13, 2004, now publication no. 2005/0144365-A1. Garbage collection may also be performed on user data update block when it becomes nearly full, rather than waiting until it becomes totally full and thereby triggering a garbage collection operation that must be done immediately before data provided by the host can be written into the memory.

In some memory systems, the physical memory cells are also grouped into two or more zones. A zone may be any partitioned subset of the physical memory or memory system into which a specified range of logical block addresses is mapped. For example, a memory system capable of storing 64 Megabytes of data may be partitioned into four zones that store 16 Megabytes of data per zone. The range of logical block addresses is then also divided into four groups, one group being assigned to the physical blocks of each of the four zones. Logical block addresses are constrained, in a typical implementation, such that the data of each are never written outside of a single physical zone into which the logical block addresses are mapped. In a memory cell array divided into planes (sub-arrays), which each have their own addressing, programming and reading circuits, each zone preferably includes blocks from multiple planes, typically the same number of blocks from each of the planes. Zones are primarily used to simplify address management such as logical to physical translation, resulting in smaller translation tables, less RAM memory needed to hold these tables, and faster access times to address the currently active region of memory, but because of their restrictive nature can result in less than optimum wear leveling.

Individual flash EEPROM cells store an amount of charge in a charge storage element or unit that is representative of one or more bits of data. The charge level of a storage element controls the threshold voltage (commonly referenced as $V_T$) of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels do shift as a result of charge disturbing programming, reading or erasing operations performed in neighboring or other related memory cells, pages or blocks. Error correcting codes (ECCs) are therefore typically calculated by the controller and stored along with the host data being programmed and used during reading to verify the data and perform some level of data correction if necessary. Also, shifting charge levels can be restored back to the centers of their state ranges from time-to-time, before disturbing operations cause them to shift completely out of their defined ranges and thus cause erroneous data to be read. This process, termed data refresh or scrub, is described in U.S. Pat. Nos. 5,532,962 and 5,909,449, and U.S. patent application Ser. No. 10/678,345, filed Oct. 3, 2003, now U.S. Pat. No. 7,012,835.

The responsiveness of flash memory cells typically changes over time as a function of the number of times the cells are erased and re-programmed. This is thought to be the result of small amounts of charge being trapped in a storage element dielectric layer during each erase and/or re-programming operation, which accumulates over time. This generally results in the memory cells becoming less reliable, and may require higher voltages for erasing and programming as the memory cells age. The effective threshold voltage window over which the memory states may be programmed can also decrease as a result of the charge retention. This is described, for example, in U.S. Pat. No. 5,268,870. The result is a limited effective lifetime of the memory cells; that is, memory cell blocks are subjected to only a preset number of erasing and re-programming cycles before they are mapped out of the system. The number of cycles to which a flash memory block is desirably subjected depends upon the particular structure of the memory cells, the amount of the threshold window that is used for the storage states, the extent of the threshold window usually increasing as the number of storage states of each cell is increased. Depending upon these and other factors, the number of lifetime cycles can be as low as 10,000 and as high as 100,000 or even several hundred thousand.

If it is deemed desirable to keep track of the number of cycles experienced by the memory cells of the individual blocks, a count can be kept for each block, or for each of a group of blocks, that is incremented each time the block is erased, as described in aforementioned U.S. Pat. No. 5,268,870. This count may be stored in each block, as there described, or in a separate block along with other overhead information, as described in U.S. Pat. No. 6,426,893. In addition to its use for mapping a block out of the system when it reaches a maximum lifetime cycle count, the count can be earlier used to control erase and programming parameters as the memory cell blocks age. And rather than keeping an exact count of the number of cycles, U.S. Pat. No. 6,345,001 describes a technique of updating a compressed count of the number of cycles when a random or pseudo-random event occurs.

The cycle count can also be used to even out the usage of the memory cell blocks of a system before they reach their end of life. Several different wear leveling techniques are described in U.S. Pat. No. 6,230,233, United States patent application publication no. US 2004/0083335, and in the following United States patent applications filed Oct. 28, 2002: Ser. Nos. 10/281,739 (now published as WO 2004/040578), 10/281,823 (now published as no. US 2004/0177212), 10/281,670 (now published as WO 2004/040585) and 10/281,824 (now published as WO 2004/040459). The primary advantage of wear leveling is to prevent some blocks from reaching their maximum cycle count, and thereby having to be mapped out of the system, while other blocks have barely been used. By spreading the number of cycles reasonably evenly over all the blocks of the system, the full capacity of the memory can be maintained for an extended period with good performance characteristics. Wear leveling can also be performed without maintaining memory block cycle counts, as described in U.S. application Ser. No. 10/990,189, filed Nov. 15, 2004, now publication no. 2006/0106972-A1.

In another approach to wear leveling, boundaries between physical zones of blocks are gradually migrated across the memory cell array by incrementing the logical-to-physical block address translations by one or a few blocks at a time. This is described in U.S. patent application publication no. 2004/0083335.

A principal cause of a few blocks of memory cells being subjected to a much larger number of erase and re-programming cycles than others of the memory system is the host's continual re-writing of data sectors in a relatively few logical block addresses. This occurs in many applications of the memory system where the host continually updates certain sectors of housekeeping data stored in the memory, such as file allocation tables (FATs) and the like. Specific uses of the host can also cause a few logical blocks to be re-written much more frequently than others with user data. In response to receiving a command from the host to write data to a specified logical block address, the data are written to one of a few blocks of a pool of erased blocks. That is, instead of re-writing the data in the same physical block where the original data of the same logical block address resides, the logical block address is remapped into a block of the erased block pool. The block containing the original and now invalid data is then erased either immediately or as part of a later garbage collection operation, and then placed into the erased block pool. The result, when data in only a few logical block addresses are being updated much more than other blocks, is that a relatively few physical blocks of the system are cycled with the higher rate. It is of course desirable to provide the capability within the memory system to even out the wear on the physical blocks when encountering such grossly uneven logical block access, for the reasons given above.

SUMMARY OF THE INVENTION

Housekeeping operations are carried out during the execution of a command received from the host system with which the memory system is operably connected, and within a time budget set for execution of the command. In addition to any housekeeping operation necessary for the memory system to be able to execute the command, a housekeeping operation not directly related to or required for execution of the received command may also be performed. Such unrelated housekeeping operations need not be performed each time a command is executed but rather may be limited to being carried out during only some command executions. For example, performance of an unrelated housekeeping operation that takes too much time to complete can await receipt of a command where the necessary time becomes available because a command related housekeeping operation is not necessary to execute that command. By performing housekeeping functions as part of the execution of host commands, there is no uncertainty about whether the host will permit the housekeeping operations to be completed, so long as they are completed within the known time budget set by the host.

Examples of unrelated housekeeping operations include wear leveling, scrubbing, data compaction and garbage collection, including pre-emptive garbage collection. In addition to garbage collection or any other housekeeping operation necessary to execute a command, the memory system may carry out a housekeeping operation unnecessary to execution of the command. For example, wear leveling is unnecessary to execute a write command but is conveniently carried out during the execution of such a command when there is time in the budget to do so. The time budget is established by a host time-out or the like for executing a command such as a data write, or the existence of a certain minimum required data transfer rate during writing or reading in an application to which the memory system is likely to be put. In one specific example, where there is not enough time to perform multiple housekeeping operations, wear leveling is performed during execution of those write commands where garbage collection is unnecessary.

Additional aspects, advantages and features of the present invention are included in the following description of exemplary examples thereof, which description should be taken in conjunction with the accompanying drawings.

DESCRIPTION OF EXEMPLARY EMBODIMENTS

Memory Architectures and Their Operation

Figure 1A:
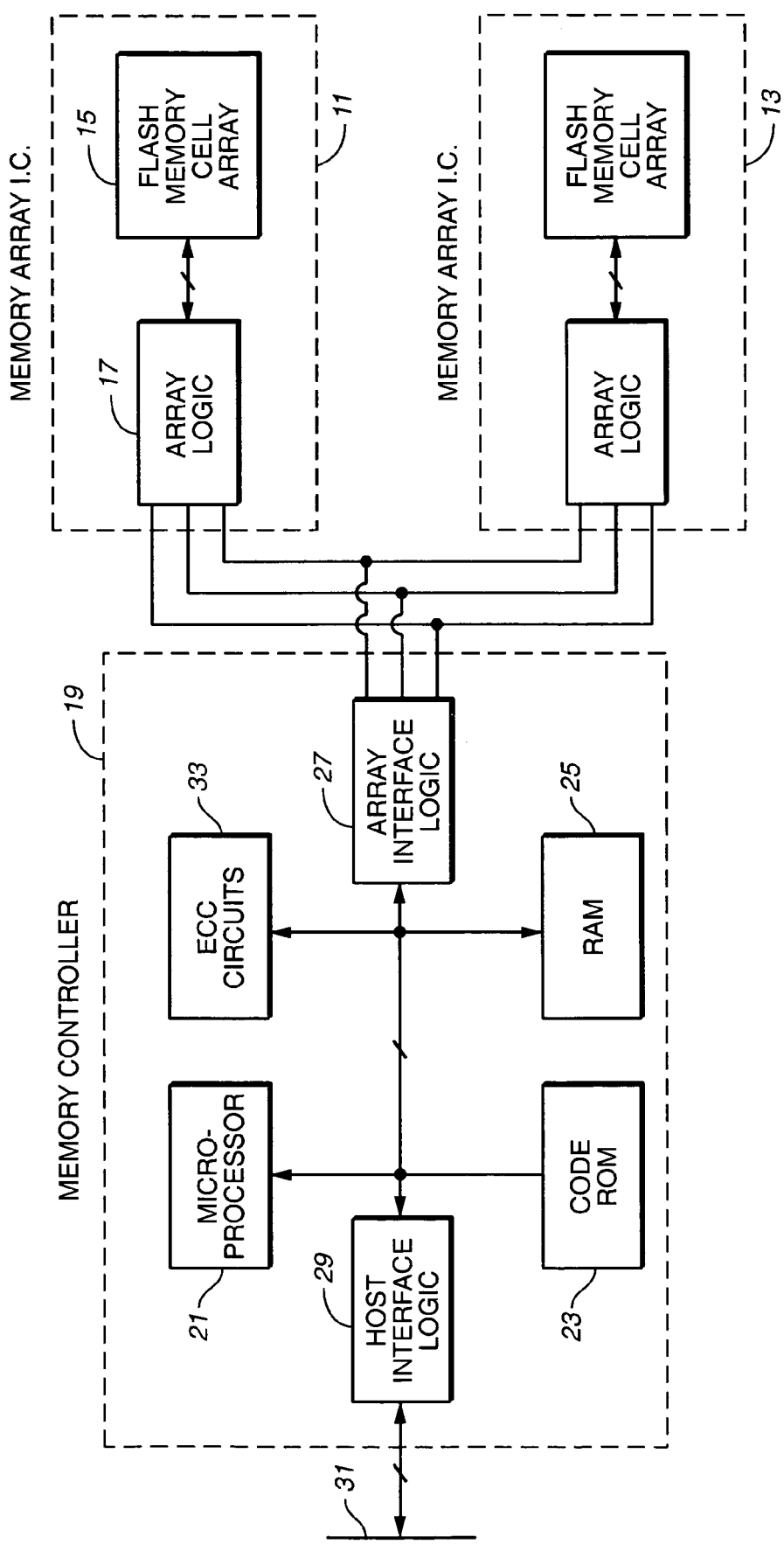
FIGS. 1A and 1B are block diagrams of a non-volatile memory and a host system, respectively, that operate together.

Referring initially to FIG. 1A, a flash memory includes a memory cell array and a controller. In the example shown, two integrated circuit devices (chips) 11 and 13 include an array 15 of memory cells and various logic circuits 17. The logic circuits 17 interface with a controller 19 on a separate chip through data, command and status circuits, and also provide addressing, data transfer and sensing, and other support to the array 13. A number of memory array chips can be from one to many, depending upon the storage capacity provided. The controller and part or the entire array can alternatively be combined onto a single integrated circuit chip but this is currently not an economical alternative. A flash memory device that relies on the host to provide the controller function contains little more than the memory integrated circuit devices 11 and 13.

A typical controller 19 includes a microprocessor 21, a read-only-memory (ROM) 23 primarily to store firmware and a buffer memory (RAM) 25 primarily for the temporary storage of user data either being written to or read from the memory chips 11 and 13. Circuits 27 interface with the memory array chip(s) and circuits 29 interface with a host though connections 31. The integrity of data is in this example determined by calculating an ECC with circuits 33 dedicated to calculating the code. As user data is being transferred from the host to the flash memory array for storage, the circuit calculates an ECC from the data and the code is stored in the memory. When that user data are later read from the memory, they are again passed through the circuit 33 which calculates the ECC by the same algorithm and compares that code with the one calculated and stored with the data. If they compare, the integrity of the data is confirmed. If they differ, depending upon the specific ECC algorithm utilized, those bits in error, up to a number supported by the algorithm, can be identified and corrected.

Figure 1B:
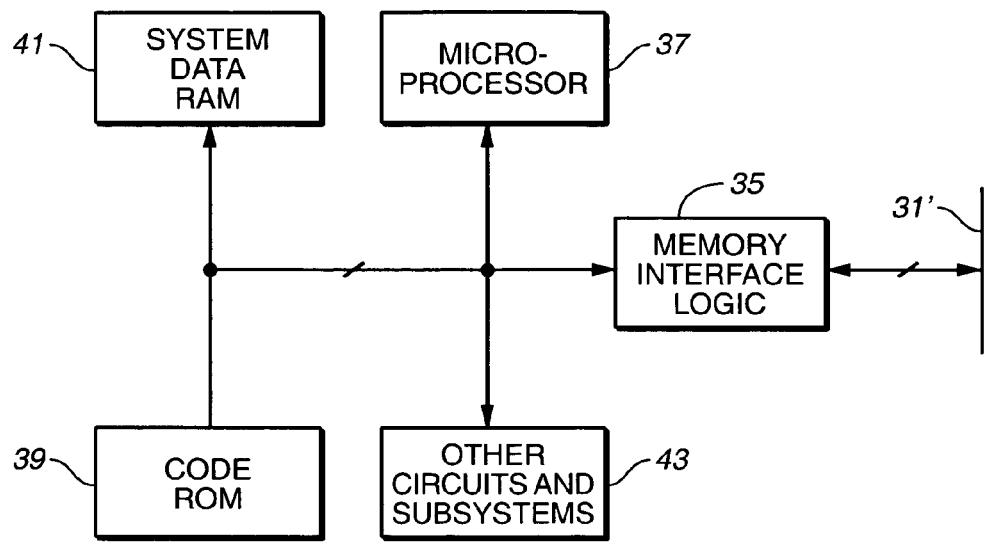

The connections 31 of the memory of FIG. 1A mate with connections 31' of a host system, an example of which is given in FIG. 1B. Data transfers between the host and the memory of FIG. 1A are through interface circuits 35. A typical host also includes a microprocessor 37, a ROM 39 for storing firmware code and RAM 41. Other circuits and subsystems 43 often include a high capacity magnetic data storage disk drive, interface circuits for a keyboard, a monitor and the like, depending upon the particular host system. Some examples of such hosts include desktop computers, laptop computers, handheld computers, palmtop computers, personal digital assistants (PDAs), MP3 and other audio players, digital cameras, video cameras, electronic game machines, wireless and wired telephony devices, answering machines, voice recorders, network routers and others.

The memory of FIG. 1A may be implemented as a small enclosed memory card or flash drive containing the controller and all its memory array circuit devices in a form that is removably connectable with the host of FIG. 1B. That is, mating connections 31 and 31' allow a card to be disconnected and moved to another host, or replaced by connecting another card to the host. Alternatively, the memory array devices 11 and 13 may be enclosed in a separate card that is electrically and mechanically connectable with another card containing the controller and connections 31. As a further alternative, the memory of FIG. 1A may be embedded within the host of FIG. 1B, wherein the connections 31 and 31' are permanently made. In this case, the memory is usually contained within an enclosure of the host along with other components.

Figure 2:
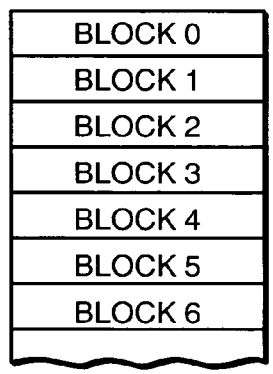
FIG. 2 illustrates a first example organization of the memory array of FIG. 1A.

The inventive techniques herein may be implemented in systems having various specific configurations, examples of which are given in FIGS. 2-6. FIG. 2 illustrates a portion of a memory array wherein memory cells are grouped into blocks, the cells in each block being erasable together as part of a single erase operation, usually simultaneously. A block is the minimum unit of erase.

Figure 3:
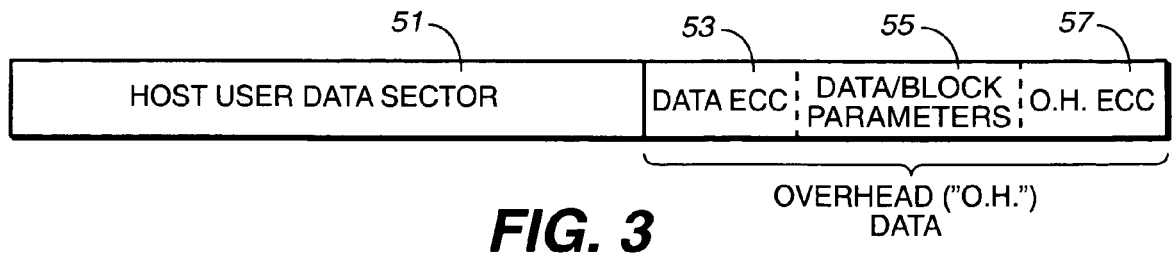
FIG. 3 shows an example host data sector with overhead data as stored in the memory array of FIG. 1A.

The size of the individual memory cell blocks of FIG. 2 can vary but one commercially practiced form includes a single sector of data in an individual block. The contents of such a data sector are illustrated in FIG. 3. User data 51 are typically 512 bytes. In addition to the user data 51 are overhead data that includes an ECC 53 calculated from the user data, parameters 55 relating to the sector data and/or the block in which the sector is programmed and an ECC 57 calculated from the parameters 55 and any other overhead data that might be included. Alternatively, a single ECC may be calculated from all of the user data 51 and parameters 55.

The parameters 55 may include a quantity related to the number of program/erase cycles experienced by the block, this quantity being updated after each cycle or some number of cycles. When this experience quantity is used in a wear leveling algorithm, logical block addresses are regularly re-mapped to different physical block addresses in order to even out the usage (wear) of all the blocks. Another use of the experience quantity is to change voltages and other parameters of programming, reading and/or erasing as a function of the number of cycles experienced by different blocks.

The parameters 55 may also include an indication of the bit values assigned to each of the storage states of the memory cells, referred to as their "rotation". This also has a beneficial effect in wear leveling. One or more flags may also be included in the parameters 55 that indicate status or states. Indications of voltage levels to be used for programming and/or erasing the block can also be stored within the parameters 55, these voltages being updated as the number of cycles experienced by the block and other factors change. Other examples of the parameters 55 include an identification of any defective cells within the block, the logical address of the block that is mapped into this physical block and the address of any substitute block in case the primary block is defective. The particular combination of parameters 55 that are used in any memory system will vary in accordance with the design. Also, some or all of the overhead data can be stored in blocks dedicated to such a function, rather than in the block containing the user data or to which the overhead data pertains.

Figure 4:
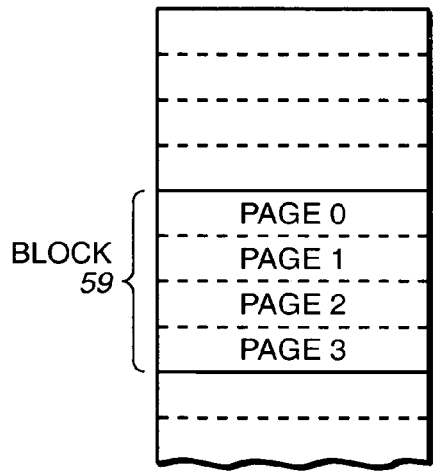
FIG. 4 illustrates a second example organization of the memory array of FIG. 1A.

Different from the single data sector block of FIG. 2 is a multi-sector block of FIG. 4. An example block 59, still the minimum unit of erase, contains four pages 0-3, each of which is the minimum unit of programming. One or more host sectors of data are stored in each page, usually along with overhead data including at least the ECC calculated from the sector's data and may be in the form of the data sector of FIG. 3.

Re-writing the data of an entire block usually involves programming the new data into an erased block of an erase block pool, the original block then being erased and placed in the erase pool. When data of less than all the pages of a block are updated, the updated data are typically stored in a page of an erased block from the erased block pool and data in the remaining unchanged pages are copied from the original block into the new block. The original block is then erased. Alternatively, new data can be written to an update block associated with the block whose data are being updated, and the update block is left open as long as possible to receive any further updates to the block. When the update block must be closed, the valid data in it and the original block are copied into a single copy block in a garbage collection operation. These large block management techniques often involve writing the updated data into a page of another block without moving data from the original block or erasing it. This results in multiple pages of data having the same logical address. The most recent page of data is identified by some convenient technique such as the time of programming that is recorded as a field in sector or page overhead data.

Figure 5:
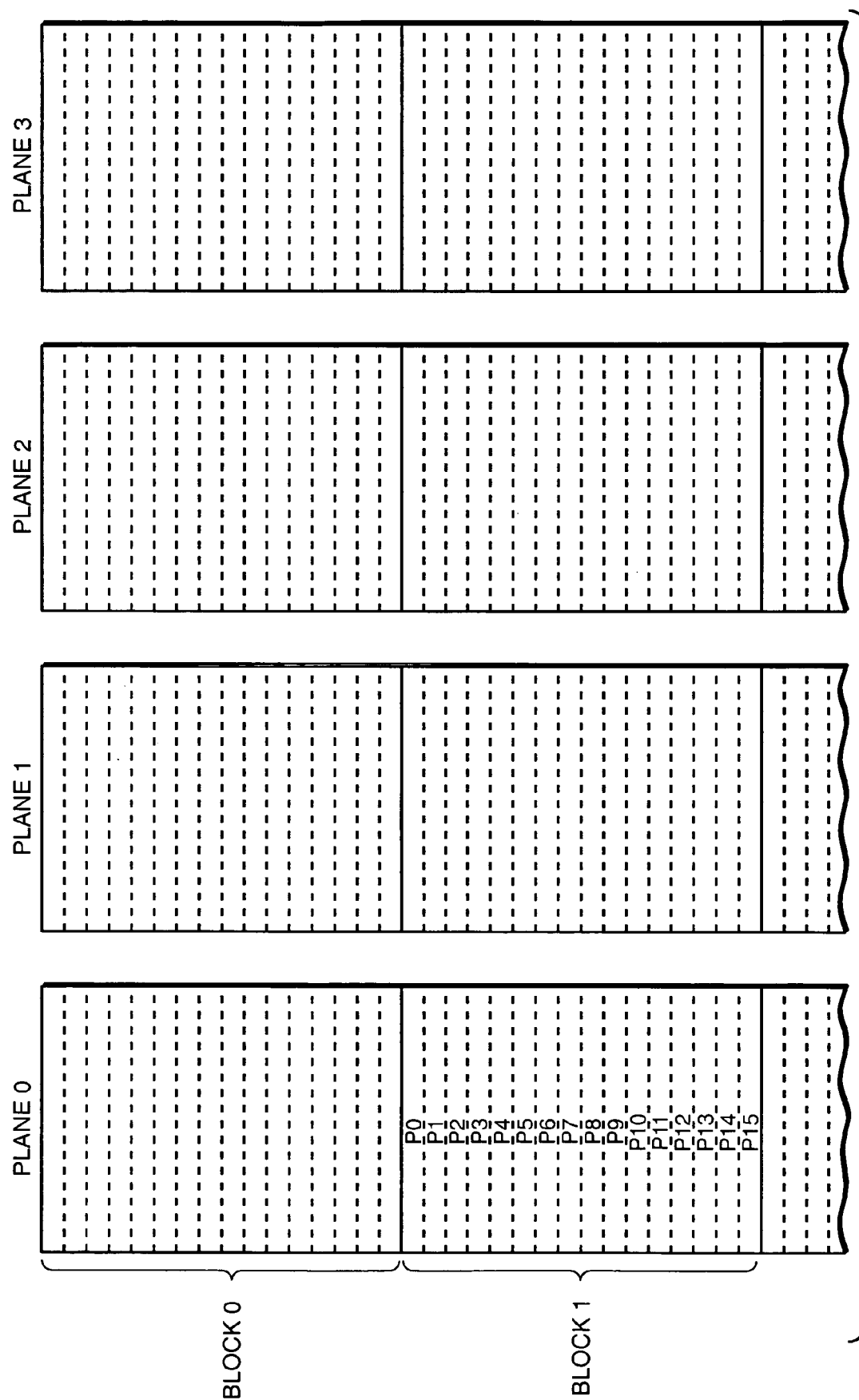
FIG. 5 illustrates a third example organization of the memory array of FIG. 1A.

A further multi-sector block arrangement is illustrated in FIG. 5. Here, the total memory cell array is physically divided into two or more planes, four planes 0-3 being illustrated. Each plane is a sub-array of memory cells that has its own data registers, sense amplifiers, addressing decoders and the like in order to be able to operate largely independently of the other planes. All the planes may be provided on a single integrated circuit device or on multiple devices. Each block in the example system of FIG. 5 contains 16 pages P0-P15, each page having a capacity of one, two or more host data sectors and some overhead data. The planes may be formed on a single integrated circuit chip, or on multiple chips. If on multiple chips, two of the planes can be formed on one chip and the other two on another chip, for example. Alternatively, the memory cells on one chip can provide one of the memory planes, four such chips being used together.

Figure 6:
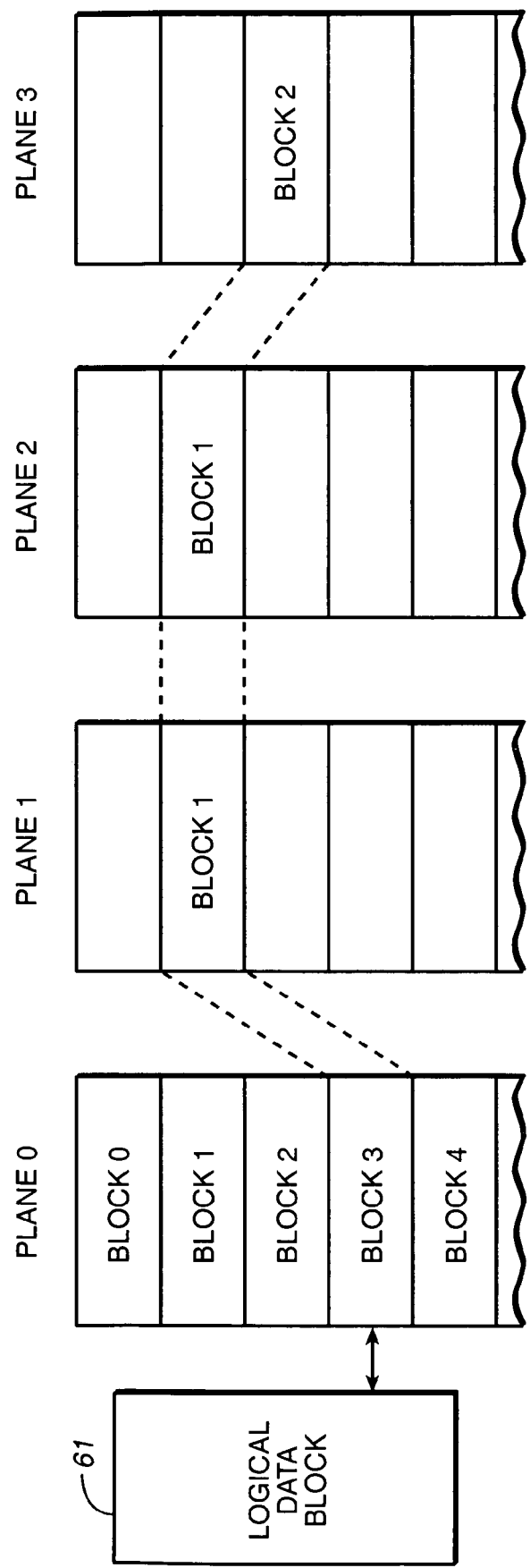
FIG. 6 shows an extension of the third example organization of the memory array of FIG. 1A.

Yet another memory cell arrangement is illustrated in FIG. 6. Each plane contains a large number of blocks of cells. In order to increase the degree of parallelism of operation, blocks within different planes are logically linked to form metablocks. One such metablock is illustrated in FIG. 6 as being formed of block 3 of plane 0, block 1 of plane 1, block 1 of plane 2 and block 2 of plane 3. Each metablock is logically addressable and the memory controller assigns and keeps track of the blocks that form the individual metablocks. The host system preferably interfaces with the memory system in units of data equal to the capacity of the individual metablocks. Such a logical data block 61 of FIG. 6, for example, is identified by a logical block addresses (LBA) that is mapped by the controller into the physical block numbers (PBNs) of the blocks that make up the metablock. All blocks of the metablock are erased together, and pages from each block are preferably programmed and read simultaneously.

Figure 7:
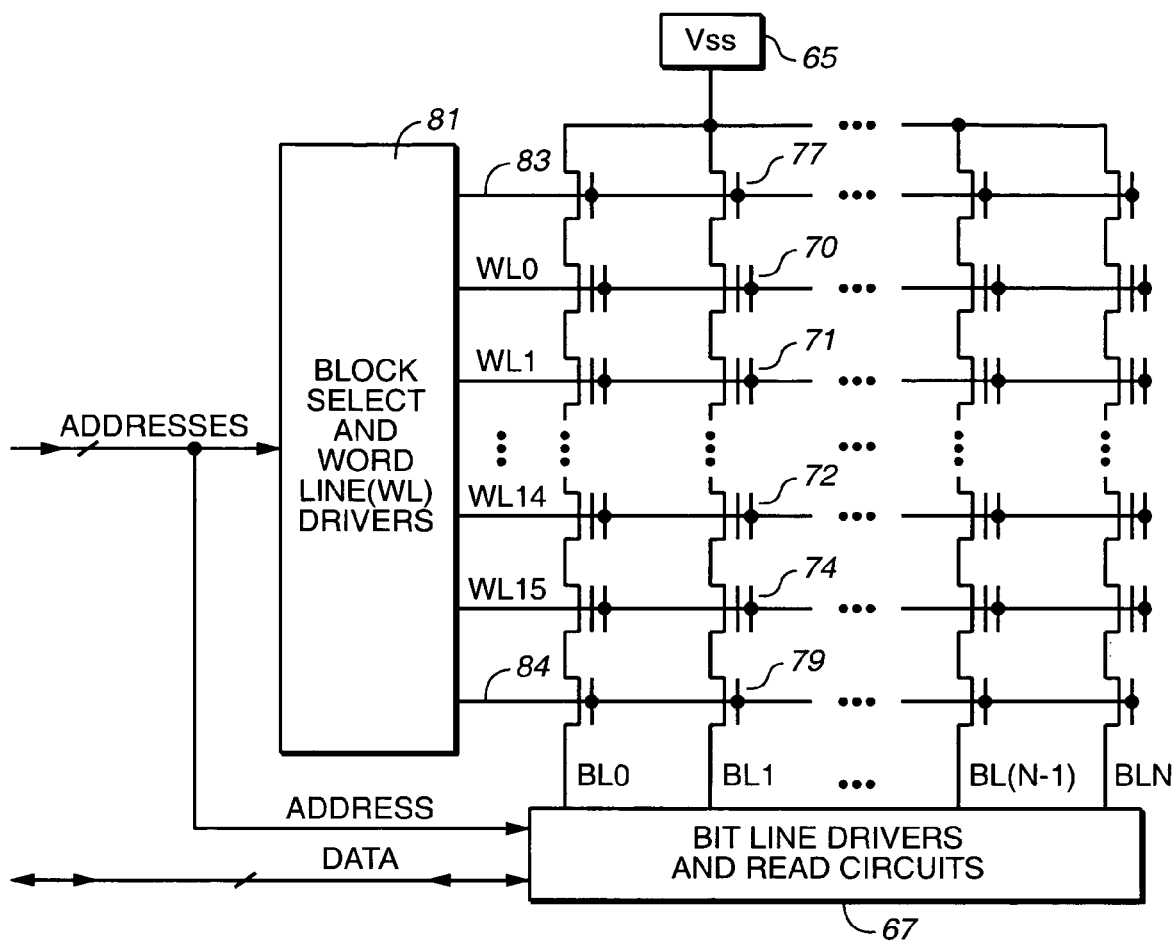
FIG. 7 is a circuit diagram of a group of memory cells of the array of FIG. 1A in one particular configuration.

There are many different memory array architectures, configurations and specific cell structures that may be employed to implement the memories described above with respect to FIGS. 2-6. One block of a memory array of the NAND type is shown in FIG. 7. A large number of column oriented strings of series connected memory cells are connected between a common source 65 of a voltage VSS and one of bit lines BL0-BLN that are in turn connected with circuits 67 containing address decoders, drivers, read sense amplifiers and the like. Specifically, one such string contains charge storage transistors 70, 71 . . . 72 and 74 connected in series between select transistors 77 and 79 at opposite ends of the strings. In this example, each string contains 16 storage transistors but other numbers are possible. Word lines WL0-WL15 extend across one storage transistor of each string and are connected to circuits 81 that contain address decoders and voltage source drivers of the word lines. Voltages on lines 83 and 84 control connection of all the strings in the block together to either the voltage source 65 and/or the bit lines BL0-BLN through their select transistors. Data and addresses come from the memory controller.

Each row of charge storage transistors (memory cells) of the block contains one or more pages, data of each page being programmed and read together. An appropriate voltage is applied to the word line (WL) for programming or reading data of the memory cells along that word line. Proper voltages are also applied to their bit lines (BLs) connected with the cells of interest. The circuit of FIG. 7 shows that all the cells along a row are programmed and read together but it is common to program and read every other cell along a row as a unit. In this case, two sets of select transistors are employed (not shown) to operable connect with every other cell at one time, every other cell forming one page. Voltages applied to the remaining word lines are selected to render their respective storage transistors conductive. In the course of programming or reading memory cells in one row, previously stored charge levels on unselected rows can be disturbed because voltages applied to bit lines can affect all the cells in the strings connected to them.

Figure 8:
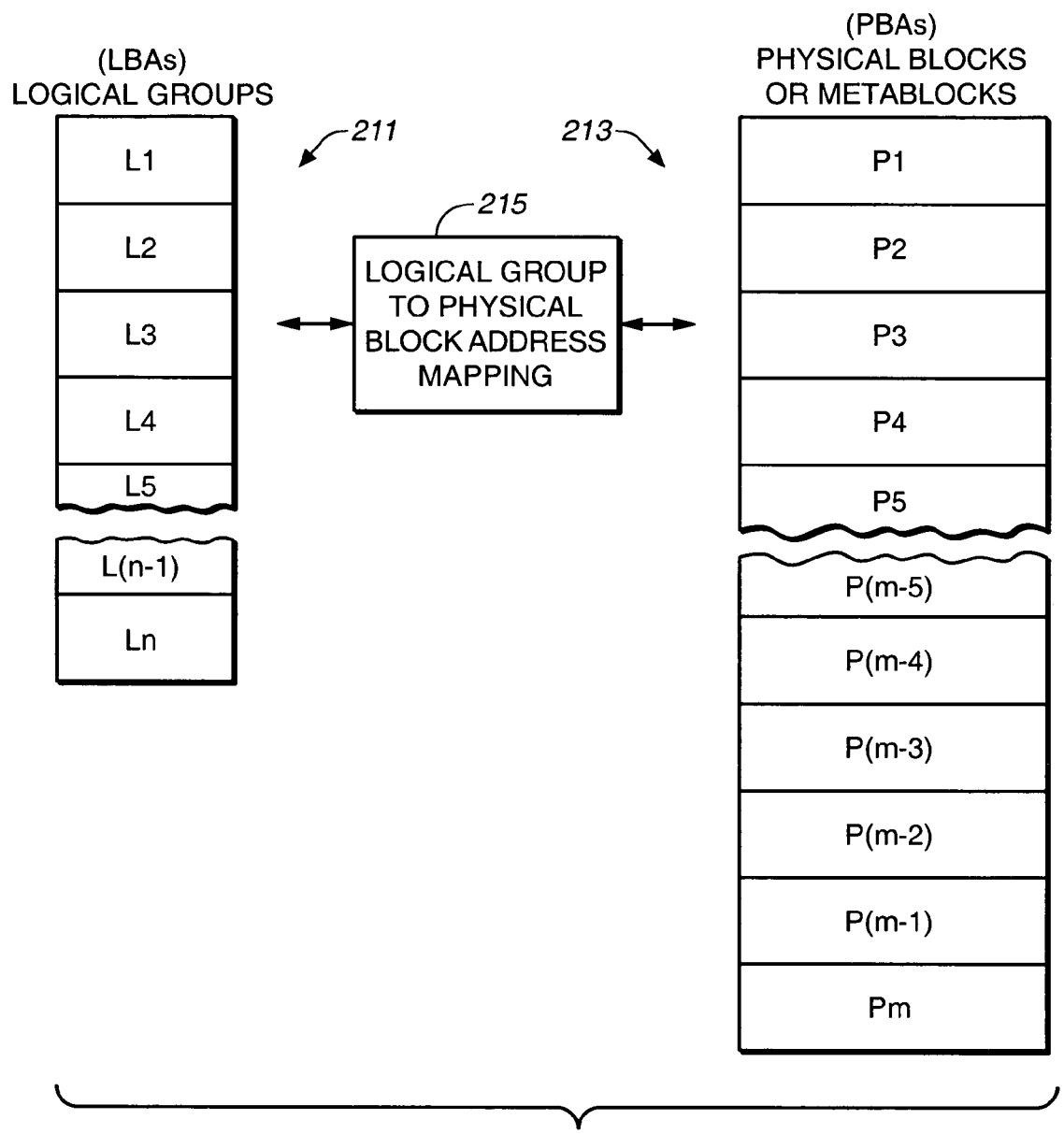
FIG. 8 illustrates an example organization and use of the memory array of FIG. 1A.

One specific architecture of the type of memory system described above and its operation are generally illustrated by FIG. 8. A memory cell array 213, greatly simplified for ease of explanation, contains blocks or metablocks (PBNs) P1-Pm, depending upon the architecture. Logical addresses of data received by the memory system from the host are grouped together into logical groups or blocks L1-Ln having an individual logical block address (LBA). That is, the entire contiguous logical address space of the memory system is divided into groups of addresses. The amount of data addressed by each of the logical groups L1-Ln is the same as the storage capacity of each of the physical blocks or metablocks. The memory system controller includes a function 215 that maps the logical addresses of each of the groups L1-Ln into a different one of the physical blocks P1-Pm.

More physical blocks of memory are included than there are logical groups in the memory system address space. In the example of FIG. 8, four such extra physical blocks are included. For the purpose of this simplified description provided to illustrate applications of the invention, two of the extra blocks are used as data update blocks during the writing of data and the other two extra blocks make up an erased block pool. Other extra blocks are typically included for various purposes, one being as a redundancy in case a block becomes defective. One or more other blocks are usually used to store control data used by the memory system controller to operate the memory. No specific blocks are usually designated for any particular purpose. Rather, the mapping 215 regularly changes the physical blocks to which data of individual logical groups are mapped, which is among any of the blocks P1-Pm. Those of the physical blocks that serve as the update and erased pool blocks also migrate throughout the physical blocks P1-Pm during operation of the memory system. The identities of those of the physical blocks currently designated as update and erased pool blocks are kept by the controller.

The writing of new data into the memory system represented by FIG. 8 will now be described. Assume that the data of logical group L4 are mapped into physical block P(m−2). Also assume that block P2 is designated as an update block and is fully erased and free to be used. In this case, when the host commands the writing of data to a logical address or multiple contiguous logical addresses within the group L4, that data are written to the update block P2. Data stored in the block P(m−2) that have the same logical addresses as the new data are thereafter rendered obsolete and replaced by the new data stored in the update block L4.

At a later time, these data may be consolidated (garbage collected) from the P(m−2) and P2 blocks into a single physical block. This is accomplished by writing the remaining valid data from the block P(m−2) and the new data from the update block P2 into another block in the erased block pool, such as block P5. The blocks P(m−2) and P2 are then erased in order to serve thereafter as update or erase pool blocks. Alternatively, remaining valid data in the original block P(m−2) may be written into the block P2 along with the new data, if this is possible, and the block P(m−2) is then erased.

In order to minimize the size of the memory array necessary for a given data storage capacity, the number of extra blocks are kept to a minimum. A limited number, two in this example, of update blocks are usually allowed by the memory system controller to exist at one time. Further, the garbage collection that consolidates data from an update block with the remaining valid data from the original physical block is usually postponed as long as possible since other new data could be later written by the host to the physical block to which the update block is associated. The same update block then receives the additional data. Since garbage collection takes time and can adversely affect the performance of the memory system if another operation is delayed as a result, it is not performed every time that it could. Copying data from the two blocks into another block can take a significant amount of time, especially when the data storage capacity of the individual blocks is very large, which is the trend. Therefore, it often occurs when the host commands that data be written, that there is no free or empty update block available to receive it. An existing update block is then garbage collected, in response to the write command, in order to thereafter be able to receive the new data from the host. The limit of how long that garbage collection can be delayed has been reached.

First Wear Leveling Embodiment

Figure 9:
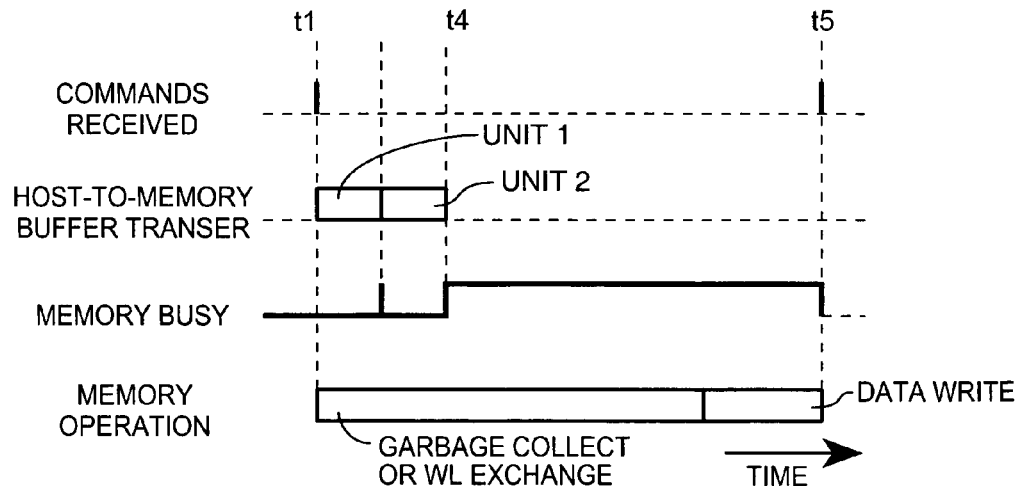
FIG. 9 is a timing diagram that provides an example operation of the memory system to execute a write command according to a first embodiment.

FIG. 9 illustrates operation of a memory system when none of the two update blocks is free and erased, and data of a block not associated with either of the update blocks is being updated. One of the update blocks must then be garbage collected to make a blank erased update block available for receiving the new data from the host. In the example of FIG. 9, two sectors or other units 1 and 2 of data are being written. The host write command includes the length of the data transfer, in this case two units, followed by the data. As shown in the second line of the timing diagram of FIG. 9, these two data units are transferred in immediate succession to the memory system controller buffer right after a command is received (first line of FIG. 9) since the memory system busy signal (third line of FIG. 9) between them is not maintained. When asserted, the memory system busy signal causes the host to pause in its communications with the memory system.

Assertion of the busy signal by the memory system between times t4 and t5, as shown, allows the memory system to perform garbage collection, when necessary to execute the write command, and then write the data received. The host does not send another command or any further data to the memory system when its busy signal is active. As shown in the last line of FIG. 9, this creates time to do garbage collection when necessary to create a new update block. The controller uses the time taken by the transfer of data units 1 and 2 to start garbage collection but this is not enough time to complete it. So the memory system holds off the host until the garbage collection and the data write into the update block are completed. Ending the busy signal at the time t5, after completion of writing the data, then allows the host to communicate further with the memory system.

The length of the busy signal that the memory system may assert is limited, however, because most hosts allow a limited fixed amount of time for the memory system to execute a write command after a data unit is transferred. If the busy signal remains active for longer than that, some hosts may repeat the command with the data and others may abort the process entirely. The memory system is operated in a manner that does not exceed this time-out period of hosts with which the memory is designed to function. One common host time-out period is 250 milliseconds. In any event, the transfer of commands and data between a host and a memory system connected with it can be delayed by the memory system's assertion of the busy signal, so it is desirable to limit its use to situations where the delay is important to overall good performance of the memory system.

In addition to the host time-out period, operation of the memory system is also constrained, in many applications, by a minimum data flow rate that must be maintained. This can require that the duration of individual busy signals asserted by the memory system be less than that the maximum allowed by the host time-out.

Similarly, wear leveling operations are preferably scheduled to avoid excessively impacting other operations and overall memory system performance. As described in the patents and applications mentioned above, wear leveling includes changing the mapping of addresses of logical groups to physical memory blocks in order to even the wear (number of erase cycles). A range of logical addresses that are constantly being rewritten, for example, are redirected from one physical block, which is being cycled at a rate higher than the average, into another physical block with a lower cycle history. There are many wear leveling algorithms, some of which monitor cycle counts of the logical group rewrites or individual physical block usage and others of which do not use such counts but otherwise distribute the wear over the memory blocks.

Typically, a wear leveling operation also involves the transfer (exchange) of data from one block to another, and this is the most time consuming part of the operation. Wear leveling exchanges are initiated from time-to-time by the memory system controller to correct for a building imbalance in the usage of the memory blocks. The purpose of wear leveling is to extend the life of the memory by avoiding one or a few blocks being cycled a number of times that exceed the useful lifetime of the memory. The loss of the use of a few, and sometimes only one, memory blocks can render the memory system inoperable.

Wear leveling is commonly performed in the background. That is, the re-mapping of blocks and any data transfer(s) takes place when the host is idle. This has the advantage of not adversely affecting the performance of the memory system but has the disadvantage that the host is not prevented from sending a command while the memory system is doing wear leveling and can even disconnect power from the memory system during the wear leveling exchange. Therefore, in the examples described herein, wear leveling is performed in the foreground, from time-to-time, as part of data writes.

Referring again to FIG. 9, in place of garbage collection, wear leveling may be performed instead when garbage collection is not necessary to execute the write command. Since both garbage collection and wear leveling involve transferring data of a block, the two operations can take similar amounts of time. Of course, as discussed above, garbage collection will be done when necessary to obtain an update block in order to be able to execute the current write command. But if there is an update block available for the new data, and garbage collection is not necessary, the time can be used instead to perform wear leveling. In one specific technique, the wear leveling algorithm indicates each time a wear leveling exchange is desirable, and the exchange takes place during the next write operation where garbage collection is not necessary.

Figure 10:
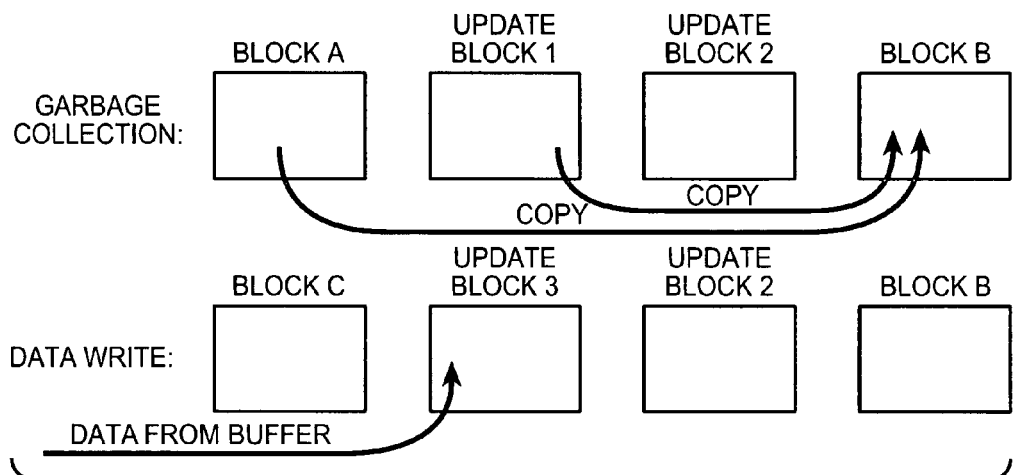
FIGS. 10 and 11 illustrate different aspects of the memory system operation with the timing of FIG. 9.

FIG. 10 illustrates an example of garbage collection and writing data in the memory system of FIG. 8 with the timing of FIG. 9. Two update blocks 1 and 2 exist but when neither is available for writing the current data units, one of them is closed and another block from the erased block pool is opened for receiving the data. This is because only two update blocks are allowed, in this example. If update block 1 is linked to block A by receiving only data updates within a common logical group, then update block 1 cannot be used to store data of some other logical group. Update block 2 can have the same limitation. Therefore, update block 1 is closed by the garbage collection operation illustrated in FIG. 10, wherein the valid data in each of the block A and its update block 1 are copied to an erased block B. Block A and update block 1 are then erased, thereby providing two more erase pool blocks. One of them can then be opened as the new second update block, noted as update block 3, in which data from the memory controller buffer are then stored.

Figure 11:
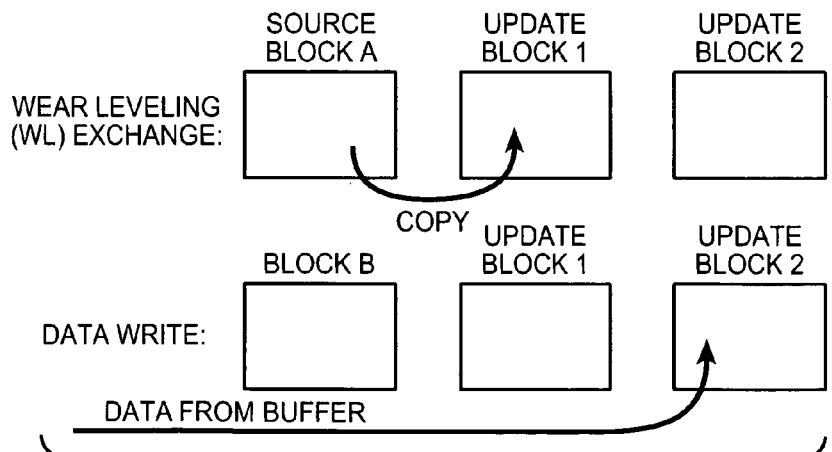

However, execution of a write command in the memory system of FIG. 8 does not always require that garbage collection be done. It is not necessary when the data can be written to an open update block, for example. In such a case, a wear leveling operation can be performed in place of garbage collection, as indicated in FIG. 9, when an update block also exists for use during the wear leveling operation. FIG. 11 further illustrates this case. Wear leveling involves, in this example, copying data from a source block A to an update block 1. Data from the controller buffer is then written to update block 2. The source block A is then erased and becomes available as an erase pool block. The example of FIG. 11 assumes that the logical group stored in source block A has the update block 1 assigned to it. Since there are normally very few system update blocks in use, this is an unusual case. More typically, a new update block needs to be opened before the data in the source block A may be subjected to a wear leveling exchange. Opening a new update block then typically involves closing another update block, which usually also includes garbage collection.

Figure 12:
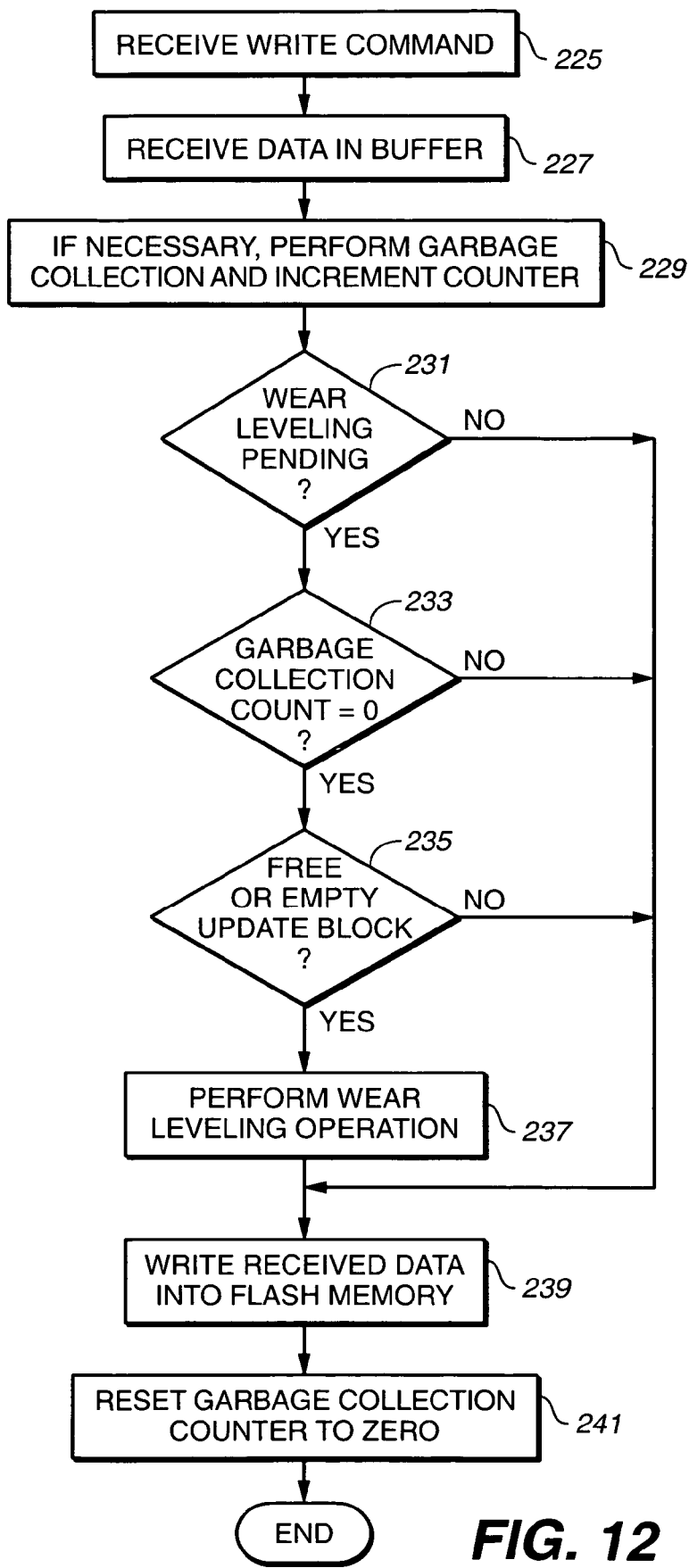
FIG. 12 is an operational flowchart showing one specific execution of the write operation illustrated by FIGS. 9-11.

A specific example of an operation according to the timing diagram of FIG. 9 is illustrated by an operational flowchart of FIG. 12, where, if garbage collection need not be done in order to allow the write operation, wear leveling is performed instead. In response to receiving a write command from the host, in a step 225, the data to be written are received from the host, in a step 227, and stored in the memory system controller buffer memory. In a step 229, it is determined whether garbage collection is necessary to free up an update block for use with the current write operation and, if so, garbage collection is performed. The order of the steps 227 and 229 may be reversed, or, as shown in FIG. 9, may be carried out simultaneously for a part of the time. Step 229 also includes incrementing a garbage collection counter if garbage collection is performed. The counter has previously been reset, and this count is referenced later to determine whether garbage collection occurred or not.

In a next step 231, it is asked whether a wear leveling exchange is pending. That is, it is determined whether the conditions necessary to initiate wear leveling exist. As the patents and patent applications referenced above demonstrate, there are a large number of different wear leveling algorithms with different events triggering their operation. In the wear leveling embodiment described herein, wear leveling is initiated every N erase cycles of memory blocks or metablocks. The number N may be around 50, for example. Although this is the starting point, as described hereinafter, the determination becomes somewhat more complicated when wear leveling must be postponed for significant periods of time. Such postponement can occur, for example, when a large number of successive write operations each require garbage collection. There is then no memory system busy periods that can be used for wear leveling. This occurs when there are a number of writes in succession of single units of data in different logical groups, for example.

If wear leveling is pending, a next step 233 checks the count of the garbage collection counter. If the count is not zero, this indicates that a garbage collection operation was performed in the step 229 and, therefore, there is not enough time to also do wear leveling. So wear leveling is skipped. If the count is zero, however, this indicates that no garbage collection occurred, so there may therefore be enough time to do wear leveling. But first, by a step 235, it is determined whether there is a free or empty update block for use in the wear leveling. If not, wear leveling is skipped because there will not be enough time to both do the garbage collection necessary to obtain an update block and do the wear leveling. But if there is an update block available, wear leveling is performed, in a step 237, according to an algorithm described in one of the wear leveling patents and patent applications identified above, or that described below. Generally, a wear leveling operation includes opening the available update block for wear leveling, copying all the data from a source block into the opened update block, then closing the update block and updating the address translation table to re-map the logical group of the data from the source block to the update block (destination block).

Thereafter, in a step 239, the data received into the memory system controller buffer is written into a block or metablock of the flash memory. The garbage collection counter is then set back to zero, in a step 241, for use during the next data write by the process of the FIG. 12 flowchart.

An example method of initiating a wear leveling exchange will now be described. This is part of the step 231 of FIG. 12. Basically, wear leveling is initiated every N times a block of the system has been erased. In order to monitor this, a count of the number of erasures of blocks is maintained at the system level. But with this technique, it is unnecessary to maintain counts of the number of erase cycles for the blocks individually.

As reflected in the flowchart of FIG. 12, a pending wear leveling exchange may not be executed during a given data write cycle when there is insufficient time to do so. In the example of FIGS. 9 and 12, a pending wear leveling exchange will be skipped if garbage collection needs to be done in order to execute the write command. If the memory system is subjected to a series of data writes of a single sector each, where the sectors have non-contiguous logical addresses, garbage collection is performed during each write. In this and other situations, a pending wear leveling operation is postponed. Whether this type of delay occurs depends on the way in which the memory system is used. But if it happens often, the wear leveling becomes less effective. It is preferred that wear leveling occur at regular intervals of system block erasures in order to be most beneficial.

Figure 13A:
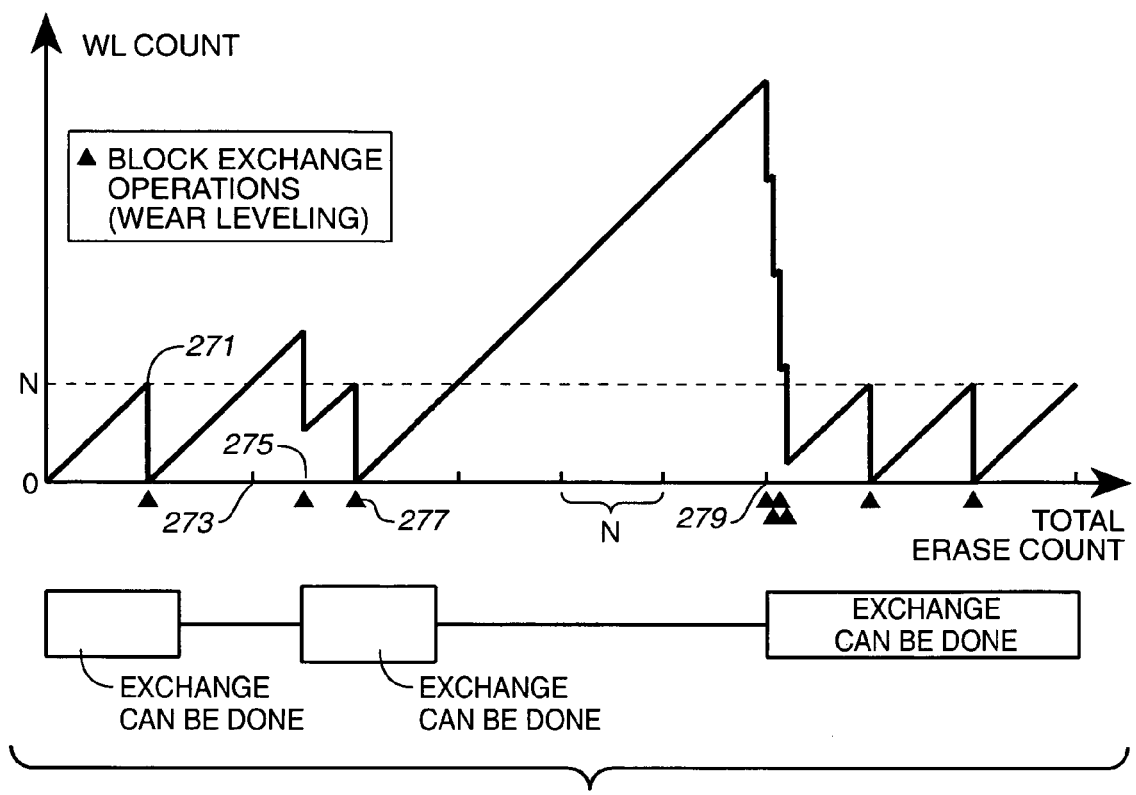
FIGS. 13A, 13B and 13C are curves that illustrate different timing for the wear leveling operation illustrated by FIG. 12.
Figure 13B:
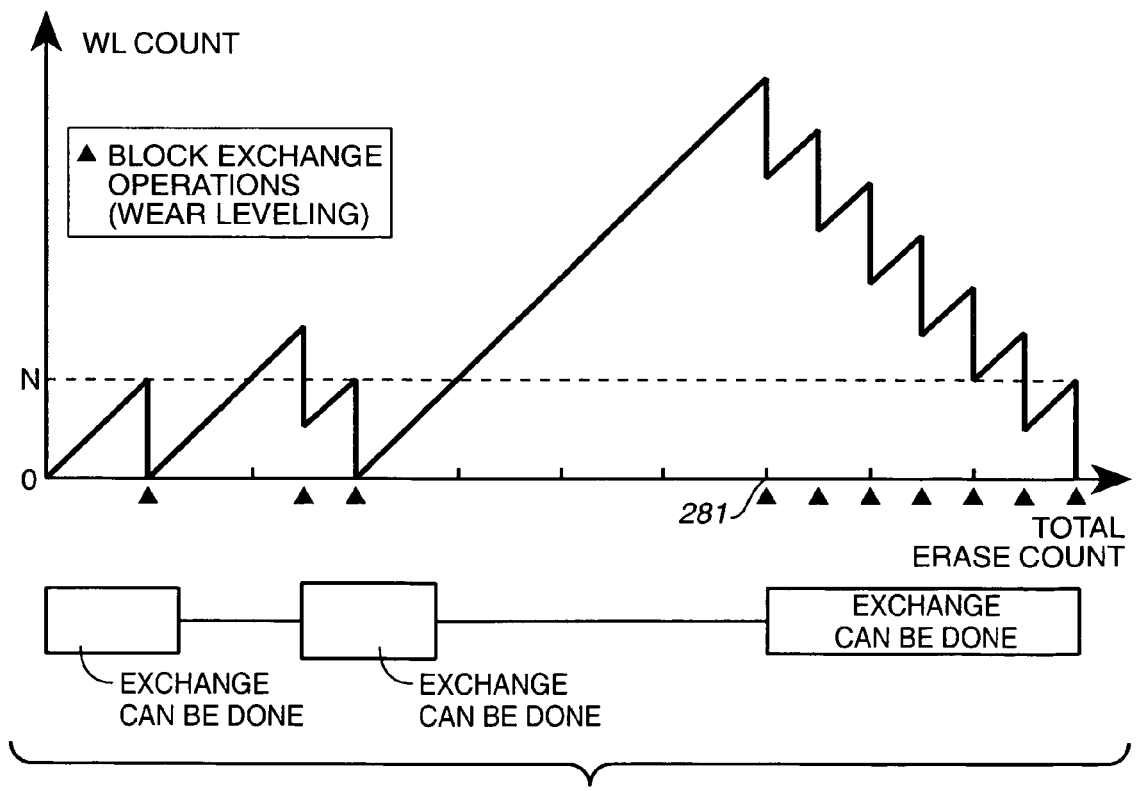
Figure 13C:
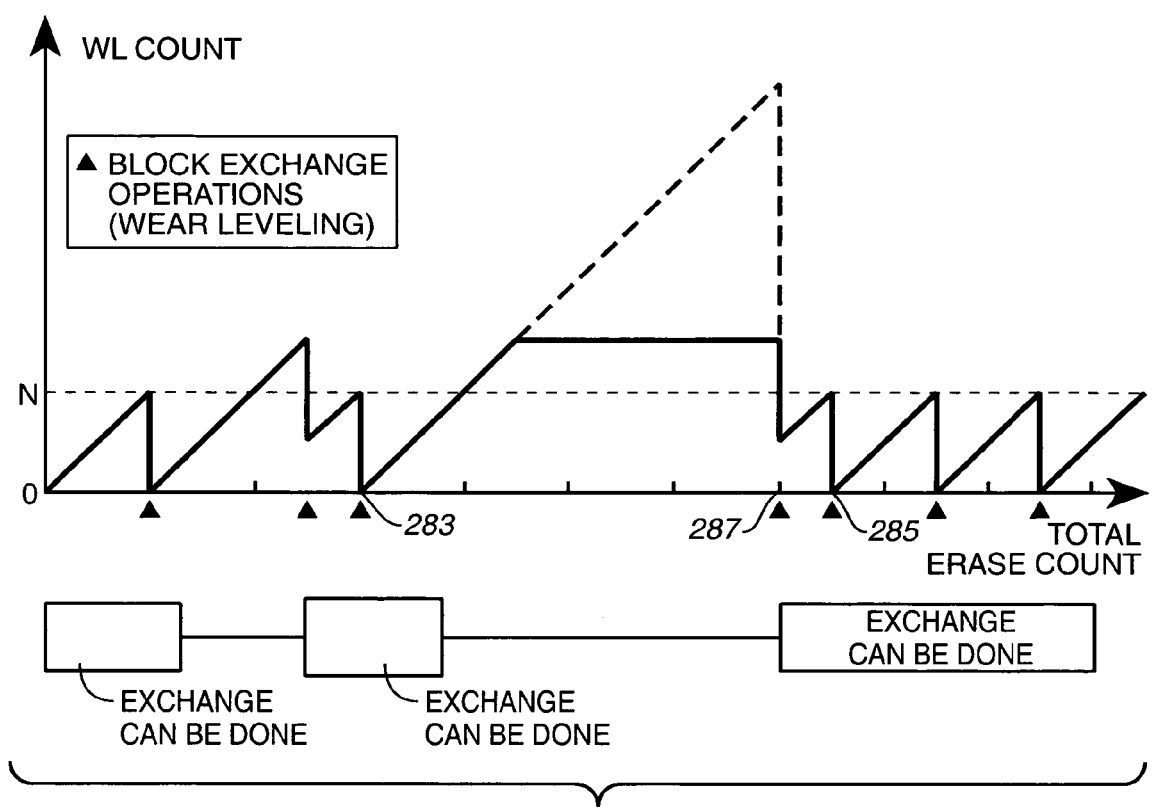

Therefore, it is desirable to vary the interval between wear leveling exchanges from the nominal N block erasure interval when wear leveling has been postponed for any significant time. The number of wear leveling operations that have been missed is maintained, and they may thereafter be individually rendered pending at intervals shorter than N block erasures apart. The curves of FIGS. 13A, 13B and 13C show three different ways to "catch up" after wear leveling has been postponed significantly beyond N erase cycles. The horizontal axes of these curves show the total block system erase count with a vertical mark every N counts. The vertical axes indicate the number of system erase cycles (WL count) since the last wear leveling operation. FIGS. 13A, 13B and 13C each indicate "exchange can be done" to note periods when a wear leveling exchange can take place, in these examples. Nominally, as the number of WL counts increases to N (dashed line across the curves), wear leveling will occur and the WL count returns to zero. This is shown at 271 of FIG. 13A, for instance.

At an erase count 273 of FIG. 13A, when the WL count has reached N, the wear leveling that is scheduled does not take place. Wear leveling does not occur for many more erase cycles, about one-half N, until erase count 275, when conditions allow wear leveling to take place. Wear leveling is performed then and again at erase count 277, after an interval less than N (about one-half N), in order to get caught up. But then there is a very long period when wear leveling cannot take place. Because of the long period, all (four in this case) of the missed wear leveling exchanges take place as soon as they can, beginning at erase count 279 and continuing during each write command thereafter, if allowed. This technique has an advantage of being simple but can adversely affect performance of the memory system if it experienced a large number of missed wear leveling exchanges in the past.

FIG. 13B illustrates a modified way to handle the case where wear leveling does not take place for a very long time. In this example, the first wear leveling exchange after the long period takes place at 281, and successive operations at one-half N erase counts. The missed wear leveling exchanges are also made up in this example but instead of performing them as quickly as possible once wear leveling can again be done, as in FIG. 13A, the technique of FIG. 13B separates the make-up wear leveling exchanges by something by at least one-half N. This technique provides a more even distribution of wear leveling exchanges.

A preferred technique is illustrated in FIG. 13C. Rather than making up all the missed wear leveling exchanges, the intervals between them are reduced somewhat but others of them are not made up at all. Wear leveling at 283 occurs one-half N erase counts from the last one, in order to make up for the delay in being able to execute the last wear leveling, the same as the examples of FIGS. 13A and 13B. But where there is the same long period of no wear leveling exchanges after that, a second wear leveling exchange at 285 after this period occurs one-half N erase cycles after the first at 287 but subsequent exchanges occur at the normal N erase cycle intervals. Several of the wear leveling exchanges that were missed are simply not made up. A specific criterion for instituting a wear leveling exchange by this technique is that when a wear leveling exchange takes place after the WL count has built up to more than N, the second exchange occurs one-half N erase counts later. But the wear leveling exchanges after that occur at the normal N erase count interval no matter how many exchanges were missed.

FIGS. 13A, 13B and 13C provide three different ways of dealing with extended periods of not being able to perform wear leveling but are not the only ways of doing so.

Second Wear Leveling Embodiment

Figure 14:
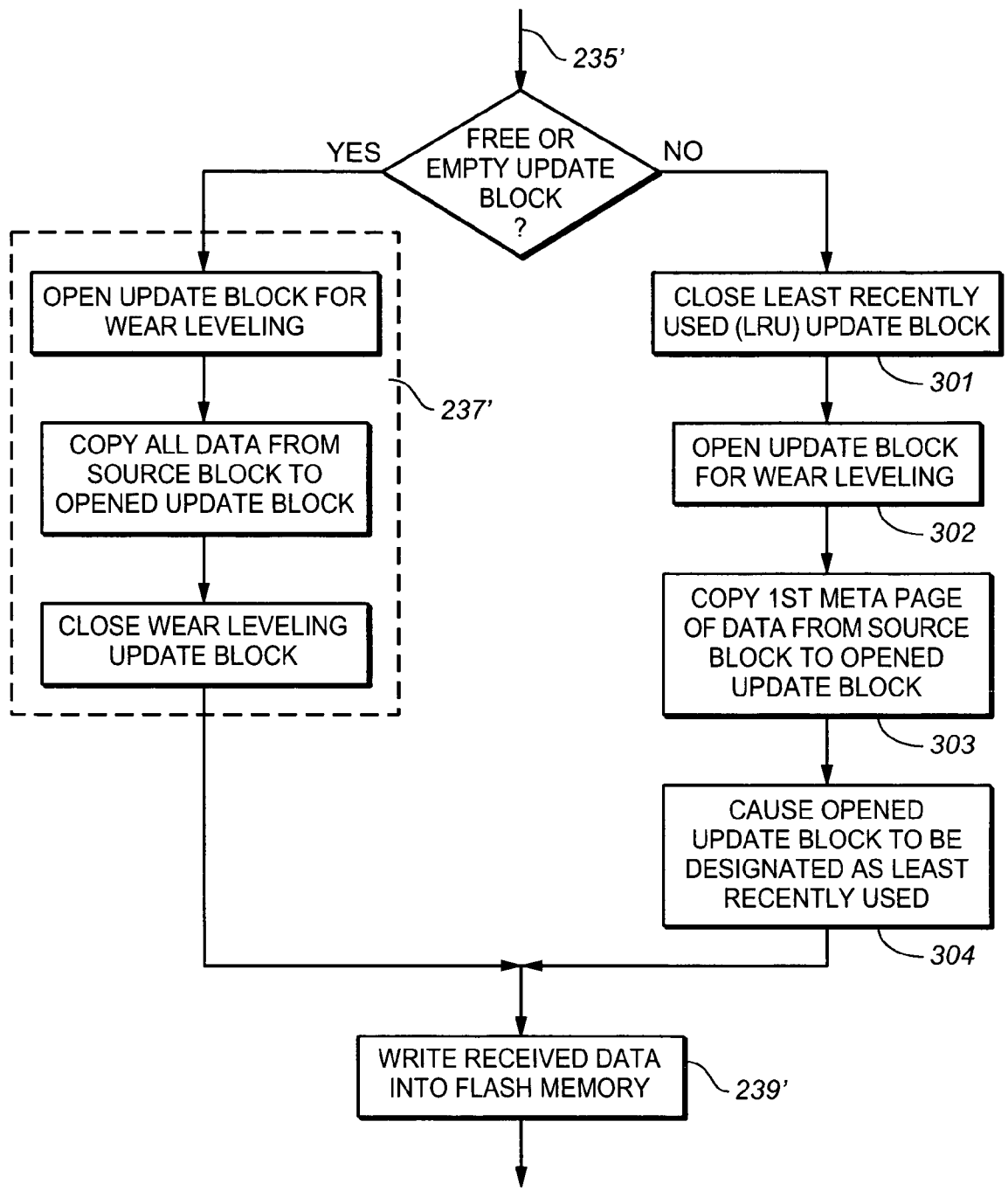
FIG. 14 is a flowchart showing operation of the memory system in response to a write command, according to a second embodiment, shown as a modification of the flowchart of FIG. 12.
Figure 15:
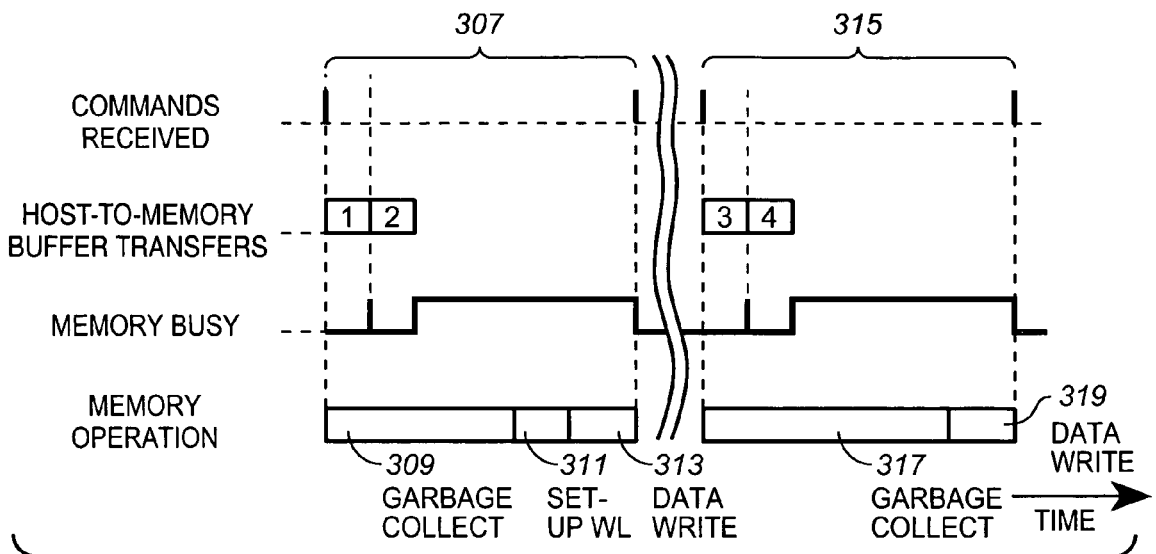
FIG. 15 is a timing diagram of an example execution of the operation illustrated in the flowchart of FIG. 14.
Figure 16:
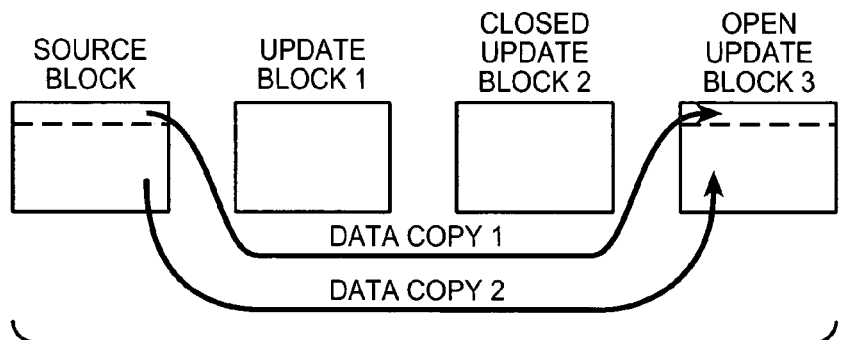
FIG. 16 illustrates one aspect of the memory system operation with the timing of FIG. 15.

FIGS. 14-16 illustrate an alternate technique for performing a wear leveling operation that does not require the pre-existence of an update block. As described above, the method of FIG. 9 skips execution of a pending wear leveling operation by the step 235 unless a free or empty update block exists. In the technique of FIG. 14, on the other hand, the determination by a corresponding step 235' that no update block is available does not cause a pending wear leveling operation to be skipped. Rather, the pending wear leveling operation is begun during execution of the current write command, in a manner that it is automatically completed at a later time. Very little time is taken during the current write command to begin the wear leveling operation, thus allowing garbage collection or another time consuming housekeeping function to also be performed during the busy period. Also, nothing further needs to be done to make sure the initiated wear leveling operation is completed during execution of a subsequent write command, since it is completed instead by a normal garbage collection operation.

If there is an update block available ("yes" at step 235', FIG. 14), wear leveling 237' takes place during execution of the current write command, corresponding to the wear leveling 239 of FIG. 9. But if none of the limited number of memory system update blocks is available, steps 301-304 of FIG. 14 set up the wear leveling operation for completion at a later time. In order to open an update block for use in the wear leveling exchange in a memory system that limits the number of update blocks that can be open at one time, an existing update block must first be closed. This is done in a step 301, wherein a system update block is closed, for example closure of the least recently used (LRU) of the system update blocks being preferred. In a next step 302, an erased block is opened as an update block for this wear leveling operation. In a next step 303, a first page or metapage (depending upon the memory architecture) of data are copied into the just opened update block from the source block. Only this one page or metapage needs to be copied during execution of the current write command but more than that may be copied if the time is available. The amount of time necessary to copy all the data from the source block to the new update block can be more than is available during execution of the current write command, particularly in the case of very large blocks. Therefore, enough is done to set up the wear leveling exchange for completion some time after execution of the current write command, preferably by copying a minimum amount of the data from the source block; preferably no more than one-quarter of the data in the source block.

As an optional optimization, a next step 304 may force the new update block with the one page or metapage of data to be identified as the least recently used (LRU) of the system update blocks. This update block is certainly not the least recently used since it was just opened. But by designating it as the LRU update block, it will be closed the next time that another update block needs to be opened. The closure process includes garbage collection to take place, most conveniently executed by copying the remaining pages from the source block into this block. This block is then closed and the necessary new update block is opened. The wear leveling exchange has then been completed during normal operation of the memory system. No special operation is necessary for completion of the wear leveling exchange, once it has been set up.

FIG. 15 illustrates this process by way of a timing diagram. Execution of the current write command with regard to example units 1 and 2 of data takes place during an interval 307. Garbage collection that is necessary to make an update block available for execution of the write command takes place during an initial interval 309, followed by an interval 311 during which the wear leveling operation is set up as described above with respect to the steps 301-304 of FIG. 14. The units 1 and 2 of data received into the controller buffer memory from the host are then written into the flash memory during an interval 313.

During a subsequent interval 315, when execution of the next write command takes place that requires garbage collection in order to provide an open update block, the garbage collection 317 completes the wear leveling exchange. Data units 3 and 4, in this example, are then written into the flash memory during an interval 319.

The process of FIGS. 14 and 15 is illustrated in yet a different way by FIG. 16. One page or metapage of data is copied from the source block designated for wear leveling, and into the newly opened update block 3 (data copy 1). Assuming a memory system that allows only two update blocks to be opened at any one time, update block 2 was closed in order to be able to open update block 3. This is executed by the steps 301-304 of FIG. 14, during the time interval 307 of FIG. 15. Thereafter, during the time interval 315 of FIG. 15, the remaining data from the source block is copied into the update block 3 (data copy 2). The garbage collection 317 made necessary to execute the subsequent write command has therefore competed the wear leveling exchange that was earlier set up.

Copying one or more pages of data into the new update block sets it up for the subsequent garbage collection without having to modify the garbage collection process. The wear leveling exchange is completed rather automatically. Alternatively, no data need be copied initially into the new update block but rather the new update block can be marked with a flag that also identifies the source block of data to be copied into it. The data exchange can then be caused to take place later in response to the flag.

Figure 17:
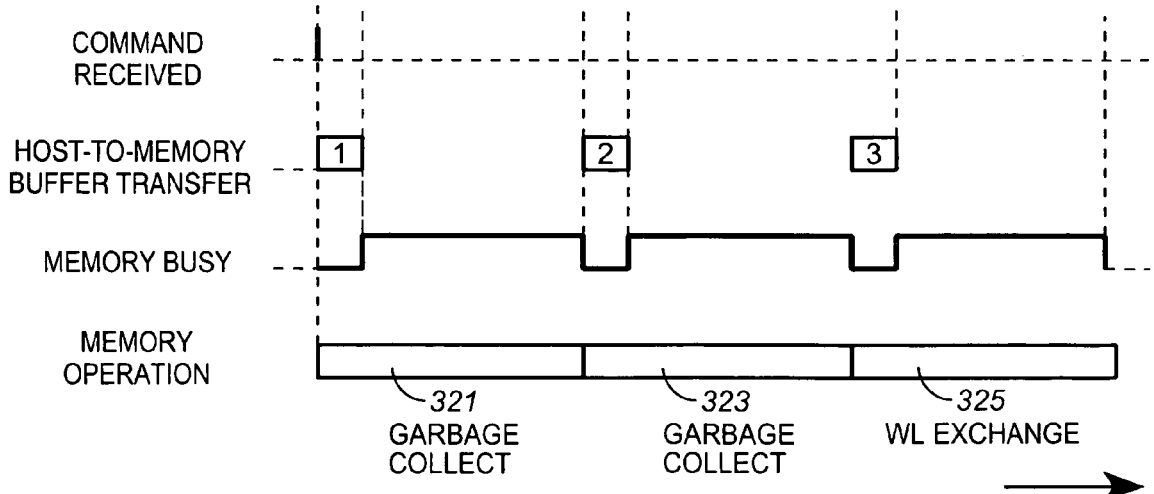
FIG. 17 is a timing diagram showing operation of the memory system that is an alternative to that of FIG. 15.

An alternate method of accomplishing the same data write and wear leveling operations is illustrated by the timing diagram of FIG. 17. The memory busy signal is asserted after transfer of each of data units 1, 2 and 3 during execution of a single write command. It is assumed for this example, as above, that garbage collection is necessary to obtain an update block to execute the write command, and then another garbage collection is necessary to perform wear leveling. This take the "no" path from the block 235' of FIG. 14 but handles the situation differently than there shown. Garbage collection 321 (FIG. 17) necessary for writing the data takes place during the first busy signal. Garbage collection 323 then creates an update block for a wear leveling exchange during the second busy signal. The entire wear leveling exchange 325 then takes place during the third busy signal, and the data units 1, 2 and 3 are later (not shown) written to the flash memory.

The same functions take place in the example of FIG. 17 as in that of FIGS. 14-16 but has required an extra busy signal period to accomplish them. The memory performance is thereby better with the example of FIGS. 14-16 by utilizing the garbage collection operation 319 for both executing a write command and performing most of the wear leveling exchange.

By the example of FIGS. 14-16, a wear leveling exchange may be initiated each time one is pending. Therefore, wear leveling can regularly occur every N memory system erase cycles without having to be skipped as it was in the first embodiment above. Thus, procedures like those in FIGS. 13A, 13B and 13C are unnecessary.

Third Wear Leveling Embodiment

Figure 18:
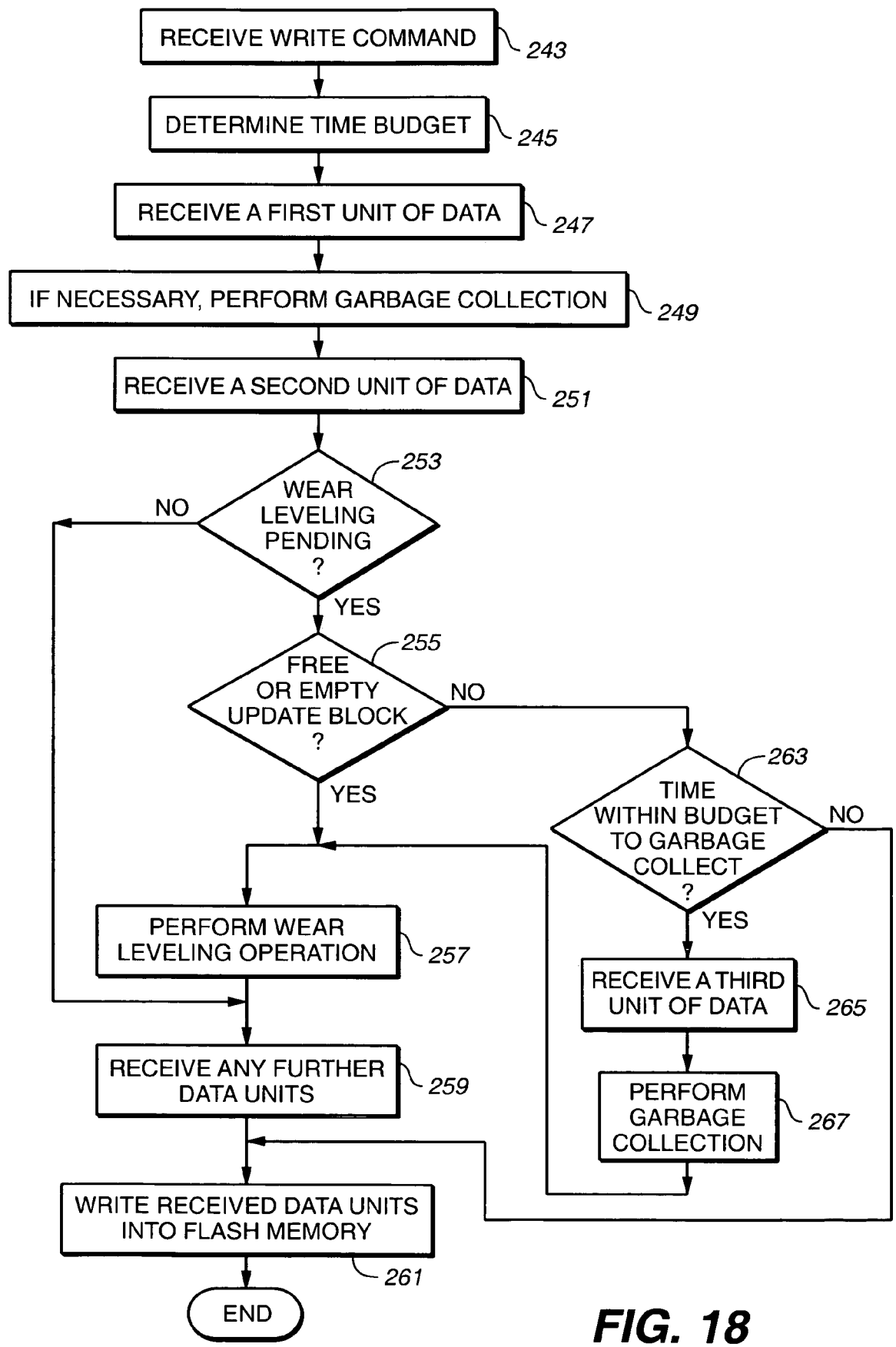
FIG. 18 is a flowchart illustrating operation of the memory system during execution of a write command, according to a third embodiment.
Figure 19:
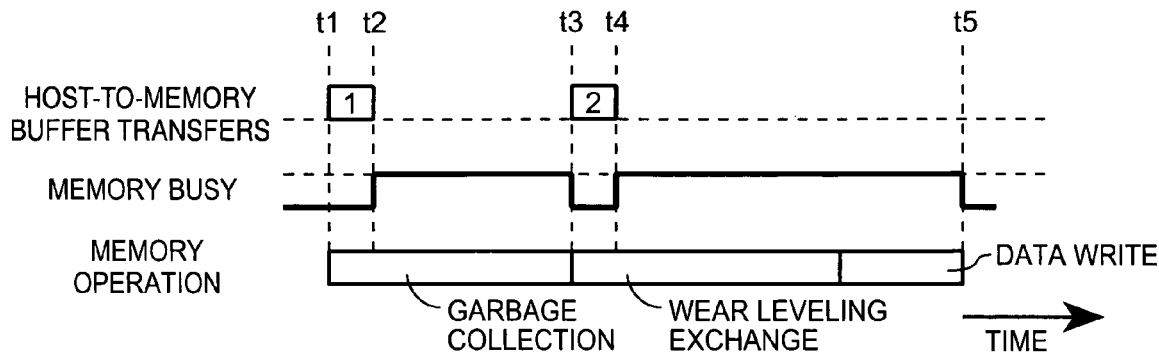
FIG. 19 is a timing diagram showing an example operation of the memory system according to the flowchart of FIG. 18.
Figure 20:
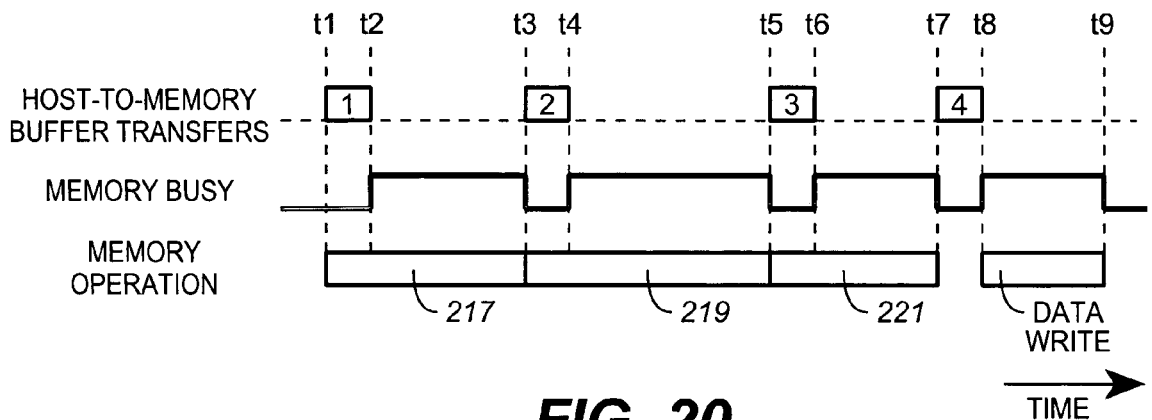
FIGS. 20 and 21 are timing diagrams that illustrate further embodiments of the memory system operation.

An operational flowchart of FIG. 18 is similar to that of FIG. 12 but implements performance of a housekeeping task or tasks during multiple successive busy periods. After receiving a write command, in a step 243, a time budget is calculated in a next step 245. That is, the amount of time that is available in this write operation to perform housekeeping operations is initially determined. This involves primarily multiplying (1) the maximum duration of the memory system busy signal that can be asserted after each unit of data is transferred without exceeding the host time-out by (2) the length of the data transfer in terms of the number of units of data being transferred by the present write command. This is because the time available for the controller to do housekeeping occurs coincident with and after each unit of data is transferred, as best shown in FIGS. 19 and 20 described below.

By a next step 247, a first of the multiple units of data is received into the controller buffer memory, and garbage collection is commenced, in a step 249, if necessary to be able to execute the write command. The time budget determined by the step 245 can then be decreased by the amount of time taken to do the garbage collection (not shown) by decrementing a counter or the like.

In a step 251, a second unit of data is received and it is then determined whether wear leveling can also be performed during the present data write operation. By a step 253, it is determined whether there is a wear leveling exchange pending; that is, whether the conditions exist to initiate wear leveling according to the specific wear leveling algorithm that is being used. If so, in a next step 255, the existence of a free or empty update block for use in wear leveling is determined. If one exists, wear leveling is then performed (step 257), followed by receiving any further data units of the present write command (step 259) and writing the data units of the present write command into flash memory (step 261). Of course, if it is determined by the step 253 that no wear leveling exchange is pending, then the processing moves directly from there to the step 259.

Returning to the step 255, if there is no update block readily available for use during wear leveling, a next step 263 ascertains whether there is time to perform the garbage collection necessary to obtain such an update block. Since, in this example, each of the garbage collection and wear leveling exchanges are performed during a busy signal from the memory system after receipt of a unit of data from the host, this inquiry is whether there is a third unit of data. If so, it is received (step 265) and the necessary garbage collection (step 267) is performed. The wear leveling of the step 257 is thereafter performed. But if there is no time for this additional garbage collection, the process proceeds directly to the step 261.

As a variation of the process of FIG. 18, the time budget step 245 could be followed immediately by selecting those of the garbage collection and wear leveling exchanges for which there is time. The operations for which there is time can then be scheduled along. All the information necessary to do this is available immediately after receiving a write command. If a particular operation cannot be completed in one memory system busy period, it can be scheduled to extend over to another busy period. In this way, the maximum amount of time for these and other housekeeping operations can be utilized very efficiently.

One specific method of operation is shown by the timing diagram of FIG. 19, wherein both garbage collection and wear leveling take place during a single operation that writes two units 1 and 2 of data. The memory system maintains its busy signal after the transfer of the first data unit for a time sufficient to do the necessary garbage collection. As soon as the garbage collection is completed, the busy signal is removed, and the host sends the second unit of data. The memory system then again asserts the busy signal after the transfer of the second data unit for a time sufficient to perform wear leveling. Both units of data are then written from the controller buffer memory into a block of the flash memory, after which the busy signal is deactivated to indicate to the host that the memory system is ready to receive a new command. In FIG. 19, an additional busy period is inserted between the host transfers of units 1 and 2 to the memory system buffer. This is also the case in FIG. 17 described above.

Although two different housekeeping operations, namely garbage collection and wear leveling, are performed during successive memory system busy periods, only one such operation is carried out during each of the memory system busy periods of FIG. 19. Alternately, particularly in the case of garbage collection and wear leveling where most of the time is taken to transfer data between blocks, either a garbage collection or wear leveling exchange may be split between the two successive periods. In that case, a portion of the data copying is done during the first memory system busy period and then completed during the second busy period. Data write operations frequently involve the transfer of many more units of data than the two illustrated in FIGS. 9 and 19. This provides additional opportunities for performing garbage collection, wear leveling or other housekeeping functions within the memory system. FIG. 20 gives an example of this, where a host write command is for four units of data 1, 2, 3 and 4. The memory system may, if necessary or desirable, perform one or more garbage collection, wear leveling or other housekeeping operations over the successive periods 217, 219 and 221. In order to do this and write the data, the memory system inserts a busy signal period after each data transfer. This has an advantage of being able to spread execution of the housekeeping function over multiple memory system busy periods so that the duration of the individual busy periods can either be reduced or fully utilized.

In the example of FIG. 20, termination of each of the housekeeping periods 217, 219 and 221 causes the busy signal to be rendered inactive, which in turn causes the host to send the next unit of data. Alternatively, de-assertion of the busy signal need not be synchronized with the end of the periods 217, 219 and 221. Rather, the durations of the busy signal can be controlled in some other way so that the time including the periods 217, 219 and 221 can be utilized as a single period. One way to control assertion of the busy signal in this case is to make it as long as possible in each instance until the desired operation is completed, after which the busy signal is asserted for as little time as necessary. Another way of controlling the busy signal is to cause each of the busy signals to have more-or-less the same duration. This common duration is determined upon receiving the write command from the time necessary to complete the operation(s) divided by the number of units of data being transferred by the current write command.

Example Wear Leveling Algorithm

A specific wear leveling algorithm that may be executed in the step 237 of FIG. 12 and the step 257 of FIG. 18 will now be described. One source block and one destination block are selected. A pointer is incremented through the logical groups (211 of FIG. 8) in order to select the source block. After one block is subjected to wear leveling, the pointer moves to a next logical group in order, and the physical block into which the group is mapped is selected as the source block. Alternatively, the pointer may be incremented through the physical blocks directly.

The block pointed to is selected as the source block if certain additional criteria are met. The block needs to contain host data, and will not be selected if it is a reserved block containing memory system control data (in addition to what is described with respect to FIG. 8). This is because the nature of the use of reserved blocks results in them being cycled through the memory without having to do wear leveling on them. The block will also not be selected as a source block if it has an open update block associated with it. The existence of an update block means that data for the logical group mapped into the block is contained both in the block and the update block. And, of course, a block that has been mapped out because of being defective will not be selected as a source block.

If the block pointed to is not suitable as a source block for one of these or some other reason, the pointer is then incremented to the next logical group or physical block in order and this next block is also tested against the above-criteria. If this second block fails the test, then another is pointed to and tested. A maximum number is preferably placed on the number of blocks that are considered when a suitable block is not found. The current wear leveling exchange is then aborted and the search resumes during the next wear leveling exchange.

The destination block is selected from the erased pool blocks, normally the next block placed in order to be used for the storage of data from the host. But instead of storing host data, data from the source block is copied to this destination block. The mapping table (215) is then updated so that the logical group to which these data belong is mapped to the new block. The source block is then erased and placed into the erase pool.

Other Embodiments

Figure 21:
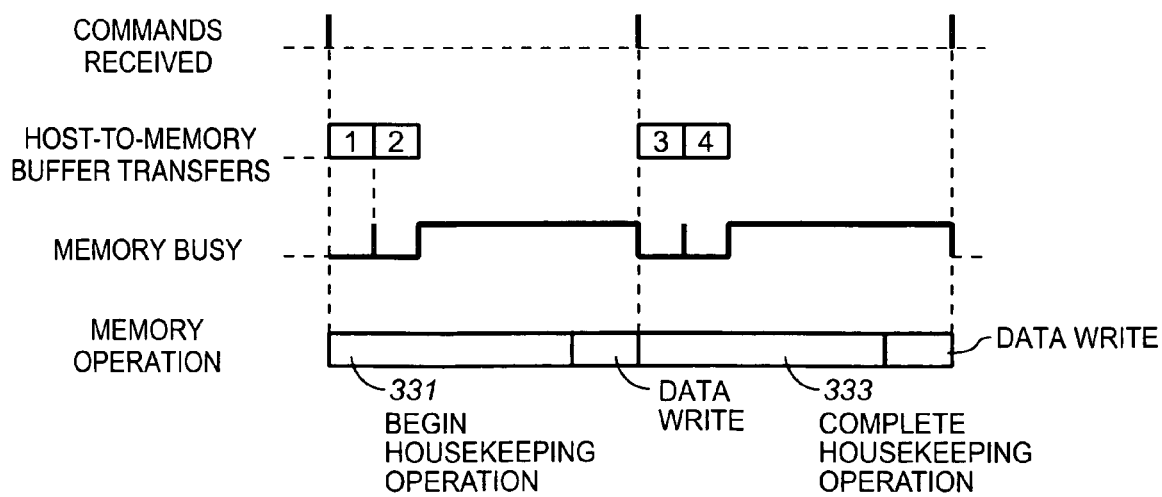

The timing diagram of FIG. 21 shows an example where a single housekeeping operation takes place during execution of two or more write commands. One part 331 of the housekeeping operation takes place during execution of one write command, and another part 333 during execution of the next write command. The housekeeping operation may be spread over more than two write command executions, and need not be performed during successive write executions, but rather can be further spread over time. An advantage of having this capability is that the times necessary to carry out specific housekeeping operations can be uncoupled from the specific write cycle memory busy signal durations. Indeed, the memory system busy signal can be made to have a uniform duration during successive write command executions, and an individual housekeeping operation may be performed over several such busy signal periods.

One other housekeeping function that can benefit from the extended busy period(s) is the refreshing (scrubbing) of the charge levels stored in the memory cells, as mentioned above. Memory cells in one or more blocks or metablocks not involved in execution of the received command are refreshed. Another is pre-emptive garbage collection, also mentioned above. Such garbage collection is also performed on data in blocks or metablocks not involved in execution of the received command. Other overhead operations similarly unnecessary to and not required for execution of the received command may also be performed during busy periods asserted by the memory system. This is particularly useful for housekeeping operations that require copying large amounts of data since such copying takes significant amounts of time. None of the wear leveling, scrubbing, pre-emptive garbage collection or other similar operations carried out during execution of a host command is an essential part of that command's execution. They are neither directly related to nor triggered by the received command. Except for the limit of the amount of time to perform such other operations, there is little limit to what can be done during execution of a host command.

Figure 22:
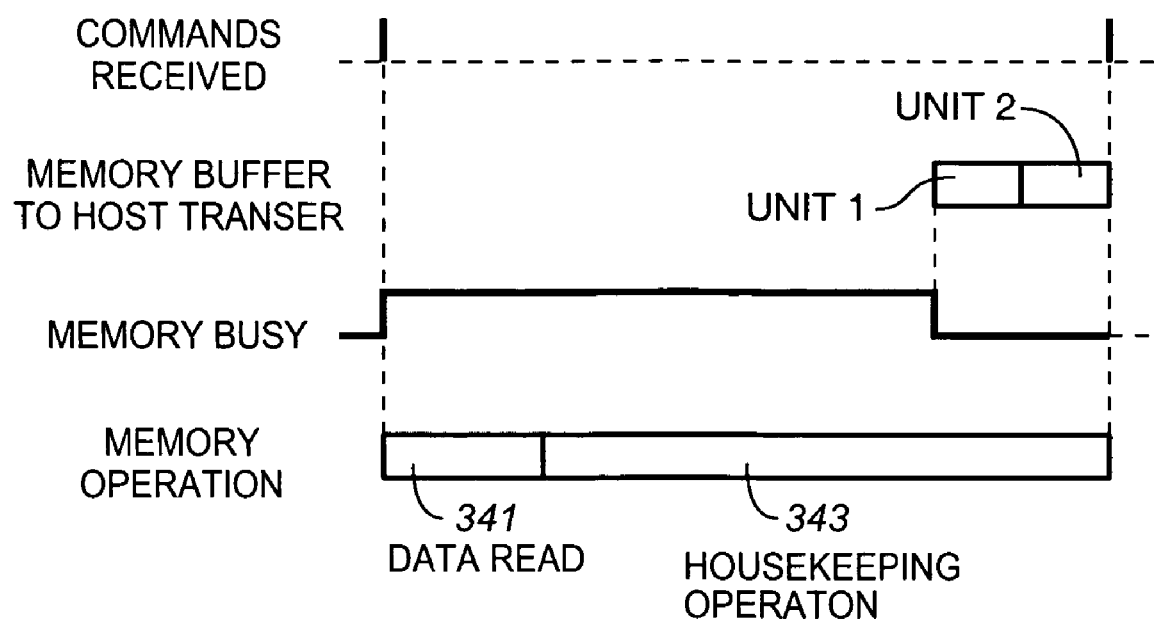
FIG. 22 is a timing diagram that illustrates utilization of the various aspects of the present invention during execution of a read command.

Further, in addition to performing such unrelated operations during execution of write commands, they can also be performed during execution of other host commands where the memory system can operate to delay receipt of a further host command by assertion of a busy signal or otherwise. One such other command is the read command. FIG. 22 shows that units of data are read from the flash memory into the controller memory during time interval 341. The memory busy signal is active during this period. But rather than dropping the busy signal immediately thereafter, it is extended to provide time for a housekeeping operation, or part of one, to take place during time interval 343. When the busy signal does drop, the units of data 1 and 2 are transferred to the host. The housekeeping operation may also be extended through this period, as shown. Many of the techniques discussed above for performing housekeeping during the execution of write commands also can be applied to doing so during execution of read commands.

CONCLUSION

Although the various aspects of the present invention have been described with respect to exemplary embodiments thereof, it will be understood that the present invention is entitled to protection within the full scope of the appended claims.

The invention claimed is:

1. A method of operating an erasable and re-programmable non-volatile memory system, which comprises, in response to receiving a command from outside the memory system having a time budget for its execution:

perform any function necessary to execute the command, assert a busy signal outside of the memory system for a time extending beyond that utilized to perform said any necessary function while remaining within the time budget, and perform during the extended busy signal time at least a portion of one housekeeping operation within the memory system that is unnecessary to execute the received command.

2. The method of claim 1, wherein the received command includes a write command followed by one or more units of data to be written into the memory system.

3. The method of claim 2, wherein a plurality of units of data to be written into the memory system are received, and wherein the busy signal is asserted in at least two intervals between receipt of the units of data, during which time said at least a portion of one housekeeping operation is performed by completing said at least one housekeeping operation.

4. The method of claim 3, wherein said at least one housekeeping operation is performed during more than one of said at least two intervals.

5. The method of claim 4, wherein said any function necessary to execute the command includes a garbage collection operation and writing the received data to the memory system.

6. The method of claim 1, wherein said one housekeeping operation includes transferring a quantity of data from one location to another location within the memory system, and wherein performing at least a portion of such a housekeeping operation includes transferring only a portion of the quantity of data during the extended busy signal time.

7. The method of claim 6, wherein remaining portions of the quantity of data are subsequently transferred during execution of a garbage collection operation not directed specifically to perform said one housekeeping operation.

8. The method of claim 1, wherein said at least one housekeeping operation includes a wear leveling operation performed in a portion of the memory not involved in the execution of the command.

9. The method of claim 1, wherein said at least one housekeeping operation includes refreshing data stored in a portion of the memory not involved in the execution of the command.

10. The method of claim 1, wherein said at least one housekeeping operation includes a garbage collection operation performed in a portion of the memory not involved in the execution of the command.

11. A method of operating an erasable and re-programmable non-volatile memory system, comprising, in response to receiving a command to transfer one or more units of data within a given time budget:
 determining whether any housekeeping operation is necessary to be able to transfer the one or more units of data,
 if any housekeeping operation is necessary to be able to transfer the one or more units of data, performing at least the necessary housekeeping operation within the given time budget,
 determining whether a housekeeping operation unnecessary to the transfer of one or more units of data is pending,
 if a housekeeping operation unnecessary to the data transfer is pending, determining whether any time remaining within the time budget, after time to perform any housekeeping operation necessary to be able to transfer the data and then to transfer said data, is sufficient for performing at least a portion of the pending housekeeping operation unnecessary to the data transfer,
 if sufficient time remains within the time budget, performing the at least a portion of the pending housekeeping operation within the given time budget that is unnecessary to the data transfer during execution of the received command, and
 transferring the one or more units of data within the given time budget.

12. The method of claim 11, wherein determining whether any housekeeping operation is necessary to be able to write the one or more units of data includes determining whether data within two or more locations of the memory need to be consolidated into a single location, and, if so, consolidating such data within the given time budget.

13. The method of claim 11, wherein determining whether a housekeeping operation unnecessary to the data transfer is pending includes identifying a pending wear leveling exchange, and wherein performing the pending housekeeping operation unnecessary to the data transfer includes performing at least a portion of the pending wear leveling exchange within the given time budget.

14. The method of claim 13, wherein performing the pending housekeeping operation unnecessary to the data transfer includes performing all of the pending wear leveling exchange within the given time budget.

15. The method of claim 11, wherein determining whether a housekeeping operation unnecessary to the data transfer is pending includes identifying an operation to refresh specified data stored in a portion of the memory system different than a portion involved in executing the received data transfer command, and wherein performing the pending housekeeping operation unnecessary to the data transfer includes refreshing at least a portion of the specified data within the given time budget.

16. The method of claim 15, wherein performing the pending housekeeping operation unnecessary to the data transfer includes refreshing all of the specified data within the given time budget.

17. The method of claim 11, wherein determining whether a housekeeping operation unnecessary to the data transfer is pending includes identifying an operation perform garbage collection in a portion of the memory system different than a portion involved in executing the received write command, and thereafter performing at least a portion of such garbage collection within the given time budget.

18. The method of claim 17, wherein performing the pending housekeeping operation unnecessary to the data transfer includes performing all of such data transfer within the given time budget.

19. The method of claim 11, additionally comprising receiving two or more units of data in succession, and wherein determining any remaining amounts of time within the time budget for performing the housekeeping operation unnecessary to the data transfer results in determining that sufficient time remains, and additionally comprises asserting at least one busy period that is unnecessary to complete execution of the data transfer command.

20. The method of claim 11, wherein if a housekeeping operation unnecessary to the data transfer is pending and there is not time within the time budget sufficient for performing at least a portion of the pending housekeeping operation unnecessary to the data transfer, adding the unperformed housekeeping operation to a count of such unperformed operations.

21. The method of claim 20, in response to multiple unperformed housekeeping operations being included in the count, causing each in order to be rendered as pending for execution during execution of all subsequent data write commands until the count is zero.

22. The method of claim 20, wherein, in response to multiple unperformed housekeeping operations being included in the count, each unperformed housekeeping operation is caused to be rendered pending one at a time in order for execution during execution of all subsequent data transfer commands until the count is zero.

23. The method of claim 20, wherein housekeeping operations unrelated to execution of the data transfer command are normally rendered at a pre-defined interval, and wherein, in response to multiple unperformed housekeeping operations being included in the count, the unperformed housekeeping operations are caused to be rendered pending one at a time in order to be performed during execution of subsequent data transfer commands at intervals less than said pre-defined interval until the count is zero.

24. The method of claim 20, wherein housekeeping operations unrelated to execution of the data transfer command are normally rendered at a pre-defined interval, and wherein, in response to multiple unperformed housekeeping operations being included in the count, at least one of the unperformed housekeeping operations is caused to be rendered pending to be performed during execution of a subsequent data transfer command at an interval less than said pre-defined interval while at least one other of the unperformed housekeeping operations is not performed.

25. A method of operating a system of erasable and re-programmable non-volatile memory cells organized into a plurality of physical blocks of a number of memory cells that are simultaneously erasable and wherein data within logical group addresses are mapped into the physical blocks, comprising in response to receiving a command to write data to one of the logical groups and the data to be written:
- determining whether data within the logical group is mapped to more than one of the physical blocks,
- determining whether there is a wear leveling exchange pending between two of the plurality of blocks, and
  - (a) if data within the logical group are mapped to more than one of the physical blocks,
    - consolidating the data of the more than one of the physical blocks into a single block, and
    - writing the received data to an update block associated with the logical group, or
  - (b) if data within the logical group are not mapped to more than one of the physical blocks but there is a wear leveling exchange pending between two of the physical blocks,
    - performing a wear leveling exchange between said two of the physical blocks, and
    - writing the received data to an update block associated with the logical group.

26. A method of operating a system of erasable and re-programmable non-volatile memory cells organized into a plurality of physical blocks of a number of memory cells that are simultaneously erasable and wherein incoming data within logical group addresses mapped to one of the physical blocks are programmed into an update physical block logically linked to said one block, comprising in response to receiving a write command and data to be written:
- determining whether an update block is available to receive the data to be written,
  - (a) if an update block is not available,
    - consolidating data of one of a plurality of update blocks with data of a physical block to which data of the update block are logically linked, thereby making an update block available, and
    - thereafter writing data to the available update block, or
  - (b) if an update block is available,
    - performing a wear leveling exchange of data between two of the physical blocks, and
    - thereafter writing data to the available update block.

27. A method of operating a system of erasable and re-programmable non-volatile memory cells organized into a plurality of physical blocks of a number of memory cells that are simultaneously erasable and wherein incoming data within logical addresses mapped to a specific physical block are instead programmed into an update physical block logically linked to said specific block, wherein a limited number of the plurality of blocks are specified to be update blocks and new update blocks are created by garbage collection that consolidates data from at Least two blocks into one block, which comprises in response to receiving a write command and data to be written:
- determining whether a housekeeping operation unnecessary to execution of the write command is pending and which includes the necessity to copy a plurality of units of data from one of the plurality of blocks to an update block,
- if so, copying one or more of the plurality of units of data but no more than one-quarter of the units from said one block into one of the update blocks during execution of the write command,
- identifying said one update block as the next in order to have its data consolidated, and
- after execution of the write command, perform garbage collection on said one update block, whereby the remaining of the plurality of units of data within said one block are placed together with the one or more copied units into a common block.

* * * * *